(12) United States Patent
Kida et al.

(10) Patent No.: US 9,239,524 B2
(45) Date of Patent: Jan. 19, 2016

(54) EXPOSURE CONDITION DETERMINATION METHOD, EXPOSURE METHOD, EXPOSURE APPARATUS, AND DEVICE MANUFACTURING METHOD INVOLVING DETECTION OF THE SITUATION OF A LIQUID IMMERSION REGION

(75) Inventors: Yoshiki Kida, Kounosu (JP); Hiroyuki Nagasaka, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 1615 days.

(21) Appl. No.: 11/887,344

(22) PCT Filed: Mar. 30, 2006

(86) PCT No.: PCT/JP2006/306675
§ 371 (c)(1),
(2), (4) Date: Sep. 17, 2009

(87) PCT Pub. No.: WO2006/106832
PCT Pub. Date: Oct. 12, 2006

(65) Prior Publication Data
US 2010/0002206 A1    Jan. 7, 2010

(30) Foreign Application Priority Data

Mar. 30, 2005 (JP) ................................ P2005-098047

(51) Int. Cl.
*G03F 7/20* (2006.01)

(52) U.S. Cl.
CPC .......... *G03F 7/7085* (2013.01); *G03F 7/70341* (2013.01)

(58) Field of Classification Search
CPC ............................ G03F 7/7085; G03F 7/70341

USPC ....................................................... 355/30, 53
See application file for complete search history.

(56) References Cited

U.S. PATENT DOCUMENTS

| | | |
|---|---|---|
| 4,346,164 A | 8/1982 | Tabarelli et al. |
| 4,480,910 A | 11/1984 | Takanashi et al. |
| 5,610,683 A * | 3/1997 | Takahashi ........................ 355/53 |
| 5,715,039 A | 2/1998 | Fukuda et al. |
| 5,825,043 A | 10/1998 | Suwa |
| 5,969,441 A | 10/1999 | Loopstra et al. |
| 6,208,407 B1 | 3/2001 | Loopstra |
| 6,590,634 B1 | 7/2003 | Nishi et al. |
| 6,611,316 B2 | 8/2003 | Sewell |

(Continued)

FOREIGN PATENT DOCUMENTS

| | | |
|---|---|---|
| DE | 221 563 | 4/1985 |
| DE | 224 448 | 7/1985 |

(Continued)

OTHER PUBLICATIONS

English Translation of the International Written Opinion issued on Jul. 2006 in corresponding International Patent Application PCT/JP2006/306675.

(Continued)

*Primary Examiner* — Chia-How Michael Liu

(57) ABSTRACT

The situation of a liquid immersion region (LR) formed on the surface of a substrate (P) is detected while changing at least one of the movement condition of the substrate (P) and the liquid immersion condition when forming the liquid immersion region (LR), and an exposure condition is determined based on the detection results.

48 Claims, 9 Drawing Sheets

(56) References Cited

U.S. PATENT DOCUMENTS

| | | | |
|---|---|---|---|
| 6,721,034 | B1 | 4/2004 | Horikawa |
| 6,778,257 | B2 | 8/2004 | Bleeker et al. |
| 6,897,963 | B1 | 5/2005 | Taniguchi et al. |
| 6,952,253 | B2 | 10/2005 | Lof et al. |
| 7,193,232 | B2 * | 3/2007 | Lof et al. ............. 250/548 |
| 2004/0103950 | A1 * | 6/2004 | Iriguchi ............. 141/2 |
| 2004/0165159 | A1 | 8/2004 | Lof et al. |
| 2005/0030497 | A1 | 2/2005 | Nakamura |
| 2005/0037269 | A1 | 2/2005 | Levinson |
| 2005/0048220 | A1 | 3/2005 | Mertens et al. |
| 2005/0132914 | A1 * | 6/2005 | Mulkens et al. ......... 101/463.1 |
| 2005/0264774 | A1 | 12/2005 | Mizutani et al. |
| 2005/0280791 | A1 | 12/2005 | Nagasaka et al. |
| 2006/0082744 | A1 | 4/2006 | Hirukawa |
| 2006/0126043 | A1 | 6/2006 | Mizutani et al. |
| 2006/0231206 | A1 | 10/2006 | Nagasaka et al. |
| 2007/0159609 | A1 | 7/2007 | Takaiwa et al. |

FOREIGN PATENT DOCUMENTS

| | | |
|---|---|---|
| EP | 1 420 298 | 5/2004 |
| EP | 1 571 699 A1 | 9/2005 |
| EP | 1 571 699 A2 | 9/2005 |
| EP | 1 628 330 A1 | 2/2006 |
| EP | 1 653 501 | 5/2006 |
| EP | 1 791 164 A1 | 5/2007 |
| JP | 58-202448 | 11/1983 |
| JP | 59-19912 | 2/1984 |
| JP | 62-65326 | 3/1987 |
| JP | 63-157419 | 6/1988 |
| JP | 4-305915 | 10/1992 |
| JP | 4-305917 | 10/1992 |
| JP | 5-62877 | 3/1993 |
| JP | 6-124873 | 5/1994 |
| JP | 7-220990 | 8/1995 |
| JP | 8-130179 | 5/1996 |
| JP | 08-130179 | 5/1996 |
| JP | 8-316125 | 11/1996 |
| JP | 10-163099 | 6/1998 |
| JP | 10-214783 | 8/1998 |
| JP | 10-303114 | 11/1998 |
| JP | 10-340846 | 12/1998 |
| JP | 11-135400 | 5/1999 |
| JP | 11-176727 | 7/1999 |
| JP | 2000-58436 | 2/2000 |
| JP | 2000-505958 | 5/2000 |
| JP | 2000-164504 | 6/2000 |
| JP | 2001-510577 | 7/2001 |
| JP | 2004-207696 | 7/2004 |
| JP | 2004-519850 | 7/2004 |
| JP | 2004-289126 | 10/2004 |
| JP | 2005-57278 | 3/2005 |
| JP | 2005-057278 | 3/2005 |
| JP | 2005-259789 | 9/2005 |
| JP | 2006-237422 | 9/2006 |
| WO | 99/23692 | 5/1999 |
| WO | 99/28790 | 6/1999 |
| WO | 99/49504 | 9/1999 |
| WO | 01/35168 | 5/2001 |
| WO | 02/069049 A2 | 9/2002 |
| WO | 2004/019128 | 3/2004 |
| WO | 2004/053958 A1 | 6/2004 |
| WO | 2004/055803 | 7/2004 |
| WO | 2004/057590 | 7/2004 |
| WO | 2004/086468 | 10/2004 |
| WO | 2004/086468 A1 | 10/2004 |
| WO | 2004/107417 A1 | 12/2004 |
| WO | 2005/010962 | 2/2005 |
| WO | 2005/029559 | 3/2005 |
| WO | 2005/076321 | 8/2005 |
| WO | 2005/076321 A1 | 8/2005 |

OTHER PUBLICATIONS

Japanese Office Action issued on Jun. 8, 2010 in corresponding Japanese Patent Application 2007-512860.

Japanese Notice of Allowance issued on Sep. 7, 2010 in corresponding Japanese Patent Application 2007-512860.

International Search Report (PCT/ISA/210) of International Application PCT/JP2006/306675 (mailed on Jul. 11, 2006).

European Search Report dated Aug. 5, 2011 in corresponding European Patent Application 06730623.3.

European Office Action dated Mar. 9, 2015 in corresponding European Patent Application No. 06730623.3.

* cited by examiner

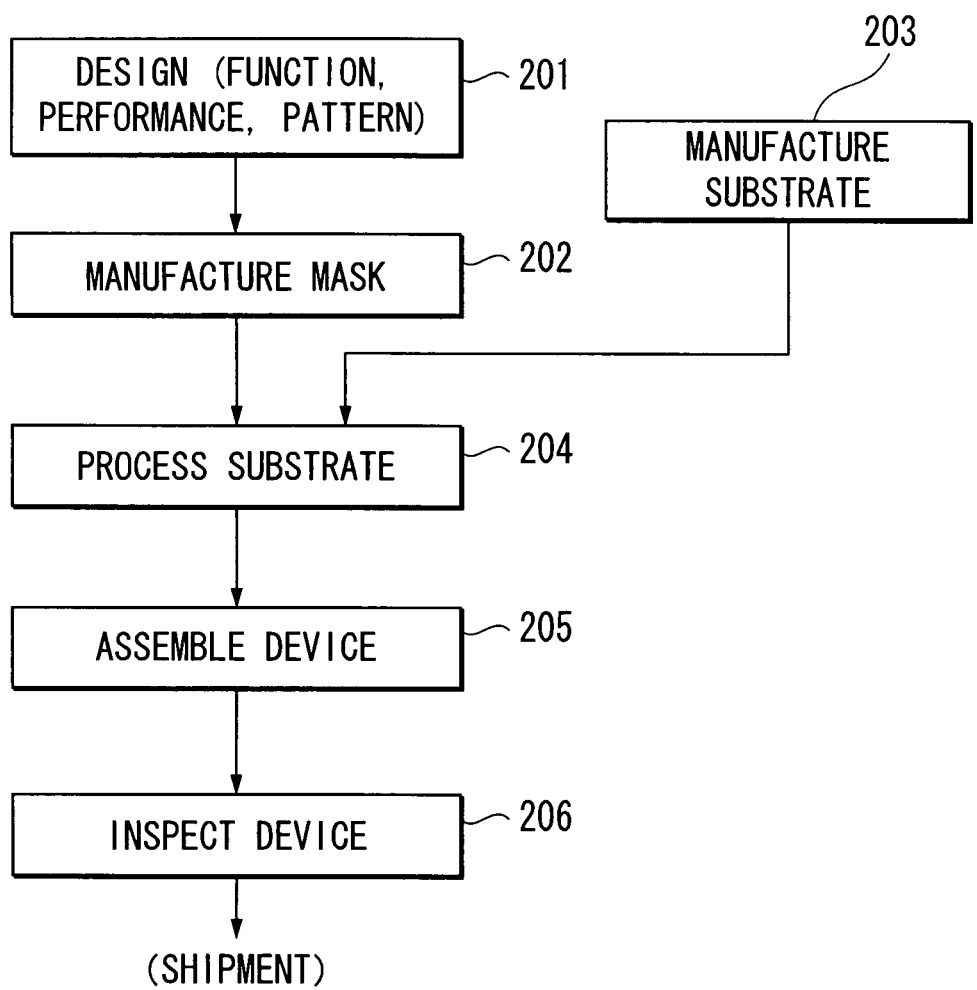

EXPOSURE CONDITION DETERMINATION METHOD, EXPOSURE METHOD, EXPOSURE APPARATUS, AND DEVICE MANUFACTURING METHOD INVOLVING DETECTION OF THE SITUATION OF A LIQUID IMMERSION REGION

CROSS REFERENCE TO RELATED APPLICATIONS

This application claims the benefit under 35 U.S.C. Section 371, of PCT International Application Number PCT/JP2006/306675, filed Mar. 30, 2006 and Japanese Application No. 2005-098047, filed Mar. 30, 2005 in Japan, the contents of which are incorporated herein by reference.

TECHNICAL FIELD

The present invention relates to an exposure condition determination method, an exposure method, and an exposure apparatus, when exposing a substrate via a liquid, and to a device manufacturing method.

BACKGROUND

In the photolithography process, which is one of the processes for manufacturing micro-devices (electronic devices etc.) such as semiconductor devices and liquid crystal display devices, an exposure apparatus that projection-exposes a pattern formed on a mask onto a photosensitive substrate is used. Such an exposure apparatus has a mask stage that is movable while holding a mask and a substrate stage that is movable while holding a substrate and, while successively moving the mask stage and the substrate stage, exposes the pattern of the mask onto the substrate. In manufacturing micro-devices, miniaturization of the pattern formed on a substrate is required in order to make such micro-devices high-density ones. To address this requirement, it is desired that the exposure apparatus have a still higher resolution. As a means for realizing such a still higher resolution, such a liquid immersion exposure apparatus as disclosed in the patent document 1, below, in which a substrate is exposed via the liquid of a liquid immersion region formed on a substrate, has been devised.

Patent Document 1: PCT International Publication WO 99/49504

DISCLOSURE OF INVENTION

Problems to be Solved by the Invention

In a liquid immersion exposure apparatus, it is important that a liquid immersion region is formed in a desired condition. When the liquid immersion region is not formed in the desired condition, and, for example, the liquid of the liquid immersion region formed on a substrate leaks away from the surface of the substrate, there may occur various kinds of disadvantages, for example, the disadvantage that surrounding devices are adversely affected or the disadvantage that with the ambience (humidity, cleanliness, etc.) in which the exposure apparatus is placed changing, the exposure accuracies including, e.g., the pattern registration accuracy on the substrate deteriorate, or the accuracies of various kinds of measurements using, e.g., an interferometer deteriorate. Thus, in order to preclude such disadvantages, it is desirable that by determining beforehand an optimum exposure condition by which the liquid immersion region can be formed in the desired condition, the substrate be exposed based on the determined exposure condition. It is therefore desired that a method by which an optimum exposure condition when a substrate is exposed via the liquid of a liquid immersion region formed on a substrate can be determined be devised.

A purpose of some aspects of the present invention is to provide a method for determining the exposure condition when a substrate is exposed via the liquid of a liquid immersion region. Another purpose is to provide an exposure method and an exposure apparatus that expose a substrate based on the determined exposure condition and a device manufacturing method.

Means for Solving the Problem

In accordance with a first aspect of the present invention, there is provided a method for determining an exposure condition when exposing a substrate by irradiating the substrate with an exposure light via a liquid of a liquid immersion region formed on the substrate, wherein the method comprises the steps of detecting the situation of the liquid immersion region formed on the surface of a predetermined object while changing at least one of the movement condition of the object and the liquid immersion condition when forming the liquid immersion region and determining the exposure condition based on the detection results. In accordance with the first aspect of the present invention, an optimum exposure condition when exposing the substrate via the liquid of the liquid immersion region can be determined.

In accordance with a second aspect of the present invention, there is provided an exposure method by which the substrate is exposed based on the exposure condition determined by the determination method of the above-described aspect. In accordance with the second aspect of the present invention, the substrate can be exposed well based on the optimum exposure condition.

In accordance with a third aspect of the present invention, there is provided a device manufacturing method that uses the exposure method of the above-described aspect. In accordance with the third aspect of the present invention, a device can be manufactured by using the exposure method by which the substrate can be exposed well.

In accordance with a fourth aspect of the present invention, there is provided an exposure apparatus that exposes a substrate via an optical member and a liquid, wherein the exposure apparatus is provided with a liquid immersion mechanism that fills a predetermined space between the optical member and the substrate with the liquid to form a liquid immersion region and with a detection device that detects the situation of the liquid immersion region while changing at least one of the movement condition of an object and the liquid immersion condition for forming of the liquid immersion region between the optical member and the object. In accordance with the fourth aspect of the present invention, it becomes possible, for example, to decide an optimum exposure condition when exposing the substrate via the liquid from the situation of the liquid immersion region detected by changing at least one of the movement condition and the liquid immersion condition.

In accordance with a fifth aspect of the present invention, there is provided a device manufacturing method that uses the exposure apparatus of the above-described aspect. In accordance with the fifth aspect of the present invention, a device can be manufactured by using the exposure apparatus in which the optimum exposure condition can be decided.

BRIEF DESCRIPTION OF THE DRAWINGS

FIG. 9 is a flowchart showing an example of a micro-device manufacturing process.

BEST MODE FOR CARRYING OUT THE INVENTION

Figure 1:
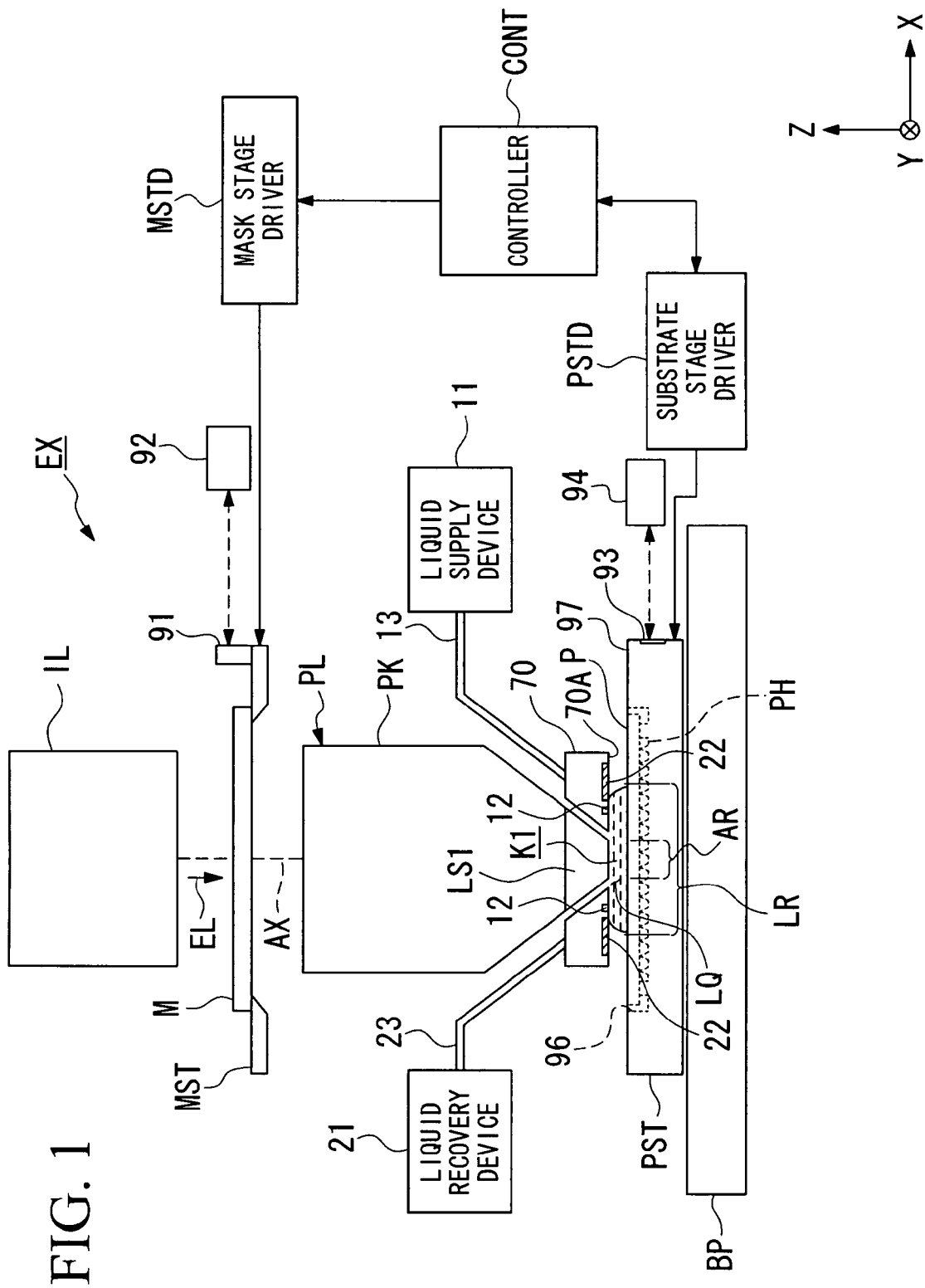
FIG. 1 is a schematic diagram showing an exposure apparatus embodiment.

In the following, embodiments of the present invention will be described referring to the drawings, but the present invention is not limited to those embodiments.

<Exposure Apparatus>

First, an embodiment of an exposure apparatus will be described referring to FIG. 1. FIG. 1 is a schematic diagram showing exposure apparatus EX. In FIG. 1, exposure apparatus EX is provided with mask stage MST that is movable while holding mask M, with substrate stage PST that has substrate holder PH which holds substrate P and that can move substrate holder PH holding substrate P, with illumination optical system IL that illuminates mask M held by mask stage MST with exposure light EL, with projection optical system PL that projects a pattern image of mask M illuminated with exposure light EL onto substrate P, and with controller CONT that controls the overall operation of exposure apparatus EX.

Exposure apparatus EX of this embodiment is a liquid immersion exposure apparatus to which a liquid immersion method is applied, with the exposure wavelength being shortened in effect, to improve the resolution and, at the same time, to widen the depth of focus and is provided with liquid immersion mechanism 1 for filling optical path space K1 of exposure light EL in the vicinity of the image plane of projection optical system PL with liquid LQ. Liquid immersion mechanism 1 is provided with nozzle member 70 that is disposed in the vicinity of optical path space K1 and that has supply ports 12 which supply liquid LQ and has collection port 22 which recovers liquid LQ, with liquid supply device 11 that supplies liquid LQ via supply pipe 13 and via supply ports 12 provided to nozzle member 70, and with liquid recovery device 21 that recovers liquid LQ via collection port 22 provided to nozzle member 70 and via recovery pipe 23. Nozzle member 70 is, above substrate P (substrate stage PST) placed so as to face projection optical system PL, formed in a ring-shaped manner so as to surround, at least, final optical element LS1 which is located nearest to the image plane of projection optical system PL among a plurality of optical elements constituting projection optical system PL.

Furthermore, exposure apparatus EX of the embodiment adopts a local liquid immersion system in which on a substrate P's portion that includes projection area AR of projection optical system PL is locally formed liquid immersion region LR that is larger than projection area AR and is smaller than substrate P. Exposure apparatus EX, at least while transferring the pattern image of mask M onto substrate P, by filling exposure light EL's optical path space K1 between final optical element LS1, which located nearest to the image plane of projection optical system PL, and substrate P placed on the image plane side of projection optical system PL with liquid LQ and by irradiating exposure light EL having passed through mask M onto substrate P via projection optical system PL and via liquid LQ filling optical path space K1, projection-exposes the pattern image of mask M onto substrate P. By supplying a predetermined amount of liquid LQ by using liquid supply device 11 of liquid immersion mechanism 1 and by, at the same time, recovering a predetermined amount of liquid LQ by using liquid recovery device 21, controller CONT fills optical path space K1 with liquid LQ to locally form on substrate P liquid immersion region LR of liquid LQ.

The embodiment will be described by assuming, as an example, a case where as exposure apparatus EX, a scan type exposure apparatus (the so-called scanning stepper) in which while synchronously moving mask M and substrate P in their respective scanning directions, the pattern formed on mask M is exposed onto substrate P is used. In the following description, it is assumed that the synchronous movement direction (the scanning direction), in a horizontal plane, of mask M and substrate P is referred to as the Y-axis direction and that the direction perpendicular to the Y-axis direction in the vertical plane (in the embodiment, the direction parallel to optical axis AX of projection optical system PL) is referred to as the Z-axis direction. Furthermore, it is assumed that the direction around the X-axis, the direction around the Y-axis, and the direction around the Z-axis are respectively referred to as the θX-direction, the θY-direction, and the θZ-direction. It should be noted that a "substrate" referred to herein comprehends a substrate over which a film of, e.g., a photosensitive material (resist) or a protective film is applied. A "mask" comprehends a reticle on which a device pattern to be reduction-projected onto the substrate is formed.

Illumination optical system IL has a light source for exposure, an optical integrator for uniforming the illuminance of the light flux emitted from the light source for exposure, a condenser lens for condensing exposure light EL from the optical integrator, a relay lens system, a field stop for setting an illumination area formed by exposure light EL on mask M, etc. A specified illumination area on mask M is illuminated, by illumination optical system IL, with exposure light EL having a uniform illuminance distribution. As exposure light EL radiated from illumination optical system IL, for example, emission lines (g-line, h-line, i-line) emitted from a mercury lamp, deep ultraviolet beams (DUV light beams) such as the KrF excimer laser beam (wavelength of 248 nm), or vacuum ultraviolet light beams (VUV light beams) such as the ArF excimer laser beam (wavelength of 193 nm) or the $F_2$ excimer laser beam (wavelength of 157 nm) may be used. In the embodiment, the ArF excimer laser beam is used.

In the embodiment, purified water is used as liquid LQ. Purified water can transmit not only the ArF excimer laser beam but also, for example, emission lines (g-line, h-line, or i-line) emitted from a mercury lamp and deep ultraviolet beams (DUV light) such as the KrF excimer laser beam (wavelength of 248 nm).

Mask stage MST is movable while holding mask M. Mask stage MST holds mask M by means of vacuum suction (or electrostatic suction). Being driven by mask stage driver MSTD including a linear motor etc. controlled by controller CONT, mask stage MST, in the state of holding mask M, is two-dimensionally movable in a plane perpendicular to optical axis AX, i.e., in the XY-plane, and is finely rotatable in the θZ-direction. On mask stage MST is set moving mirror 91. Furthermore, laser interferometer 92 is positioned at a position facing moving mirror 91. The two-dimensional position and the rotation angle in the θZ-direction (including the rotation angles in the θX- and θY-directions in some cases) of mask M on mask stage MST are measured by laser interferometer 92 in real time. The measurement results from laser interferometer 92 are outputted to controller CONT. By driving mask stage driver MSTD based on the measurement results from laser interferometer 92, controller CONT performs the position control of mask M held by mask stage MST.

It should be noted that with regard to laser interferometer 92, only a portion thereof (e.g., only its optical system) may be provided so as to face moving mirror 91. Furthermore, moving mirror 91 is not restricted to a plane mirror and may be one including a corner cube (retro-reflector); instead of fixedly setting moving mirror 91, a reflecting surface formed by mirror-finishing, for example, the end face (side face) of mask stage MST may be used. Furthermore, mask stage MST may also be configured such that it can be roughly and finely moved as disclosed in Japanese Unexamined Patent Publication No. H08-130179 (which corresponds to U.S. Pat. No. 6,721,034).

Projection optical system PL is for projecting the pattern image of mask M onto substrate P at a predetermined projection magnification of β and is constituted by a plurality of optical elements; these optical elements are held by lens barrel PK. In the embodiment, projection optical system PL is a reduction system of which projection magnification β is, e.g., ¼, ⅕, or ⅛ and forms a reduction image of the pattern of mask M onto projection area AR which is conjugate with the above-mentioned illumination area. It should be noted that projection optical system PL may be either one of a reduction system, a unit magnification system, or a magnifying system. Furthermore, projection optical system PL may be either one of a refractive system which does not include any reflecting optical member, a reflection system which does not include any refractive optical element, or a catadioptric system which includes a reflecting optical member and a refractive optical element. Still further, in the embodiment, among the plurality of optical elements constituting projection optical system PL, final optical element LS1, which is located nearest to the image plane of projection optical system PL, protrudes from lens barrel PK.

Substrate stage PST has substrate holder PH which holds substrate P; substrate stage PST is, at the image plane side of projection optical system PL, movable on base member BP. Substrate holder PH holds substrate P by means of, e.g., vacuum suction. On substrate stage PST is provided recess portion 96, and substrate holder PH for holding substrate P is disposed in recess portion 96. Furthermore, top face 97 of substrate stage PST, which is other than recess portion 96, is made a flat surface so that it has a height substantially equal to that of (constitutes the same plane as) the surface of substrate P held by substrate holder PH. This design is adopted to address the situation in which during the exposure operation on substrate P, a portion of the above-mentioned liquid immersion region LR runs off from the surface of substrate P and forms on top face 97. It should be noted that it may also be configured such that only a portion of top face 97 of substrate stage PST, e.g., only a predetermined region (including the region to which liquid immersion region LR runs off) that surrounds substrate P, is made to have substantially the same height as that of the surface of substrate P. Also, so long as optical path space K1 on the image plane side of projection optical system PL can kept to be filled with liquid LQ (i.e., liquid immersion region LR can be held well), a step may be allowed to exist between top face 97 of substrate stage PST and the surface of substrate P held by substrate holder PH. Furthermore, substrate holder PH and a portion of substrate stage PST may be integrally formed; however, in the embodiment, substrate holder PH and substrate stage PST are separately prepared, and substrate holder PH is fixed in recess portion 96 by means of, e.g., vacuum suction.

Being driven by substrate stage driver PSTD including a linear motor etc. controlled by controller CONT, substrate stage PST, in the state of holding substrate P via substrate holder PH, is two-dimensionally movable, in the XY-plane, on base member BP and is finely rotatable in the θZ-direction. Furthermore, substrate stage PST is also movable in the Z-axis-direction, in the θX-direction, and in the θY-direction. Thus, the upper surface of substrate P supported by substrate stage PST is movable in the six-degree-of-freedom directions, i.e., in the X-axis-direction, in the Y-axis-direction, in the Z-axis-direction, in the θX-direction, in the θY-direction, and in the θZ-direction. By controlling substrate stage driver PSTD, controller CONT can adjust the moving speed, the moving distance, and the moving direction of substrate stage PST.

On the side face of substrate stage PST is provided moving mirror 93. Furthermore, laser interferometer 94 is positioned at a position facing moving mirror 93. The two-dimensional position and the rotation angle of substrate P on substrate stage PST are measured by laser interferometer 94 in real time. In addition, although not shown in FIG. 1, exposure apparatus EX is provided with a focus-leveling detection system that detects the surface position information of the surface of substrate P supported by substrate stage PST. The focus-leveling detection system detects the surface position information of the upper surface of substrate P (position information in the Z-axis-direction and inclination information in the θX- and θY-directions). The measurement results from laser interferometer 94 are outputted to controller CONT. The detection results from the focus-leveling detection system are also outputted to controller CONT. By driving substrate stage driver PSTD based on the detection results from the focus-leveling detection system, controller CONT controls the focus position (Z-position) and inclination angles (θX, θY) of substrate P to adjust the surface of substrate P to the image plane of projection optical system PL and, at the same time, performs, based on the measurement results from laser interferometer 94, the position control of substrate P in the X-axis-direction, in the Y-axis-direction, and in the θZ-direction.

It should be noted that with regard to laser interferometer 94, only a portion thereof (e.g., only its optical system) may be provided so as to face moving mirror 93 and that laser interferometer 94 may be configured such that it can measure the Z-direction position and the θX- and θY-direction rotation information of substrate stage PST. An exposure apparatus provided with a laser interferometer capable of measuring the Z-direction position of substrate stage PST is detailed in, e.g., Published Japanese Translation No. 2000-510577 of the PCT International Publication WO 1999/28790. Furthermore, instead of fixedly setting moving mirror 93 on substrate stage PST, a reflecting surface formed by mirror-finishing, for example, a portion (e.g., side face) of substrate stage PST may be used.

Furthermore, while the focus-leveling detection system detects the θX- and θY-direction inclination information (rotation angle) of substrate P by measuring the Z-axis-direction position information of substrate P at each of the focus-leveling detection system's multiple measurement points, at least some of the multiple measurement points may be set within liquid immersion region LR (or projection area AR), or all of them may be set outside liquid immersion region LR. Still further, when laser interferometer 94 can measure the Z-axis direction and θX- and θY-direction position information of substrate P, it may also be configured such that the focus-leveling detection system is not provided for the purpose of enabling it to measure substrate P's Z-axis-direction position information during the exposure operation of substrate P and such that at least during the exposure operation, the position control of substrate P with respect to the Z-axis direction and θX- and θY-directions is performed by using the measurement results from laser interferometer 94.

Next, liquid immersion mechanism 1 will be described. Liquid supply device 11 of liquid immersion mechanism 1 is provided with a tank that stores liquid LQ, a compressor, a temperature regulation device that regulates the temperature of liquid LQ to be supplied, a filter unit that removes foreign particles in liquid LQ, etc. To liquid supply device 11 is connected one end portion of supply pipe 13, and the other end portion of supply pipe 13 is connected to nozzle member 70. The liquid supply operation of liquid supply device 11 is controlled by controller CONT. By controlling liquid supply device 11, controller CONT can adjust the per-unit-time liquid supply amount from supply ports 12. It should be noted that exposure apparatus EX need not be supplied with all of the tank, the compressor, the temperature regulation device, the filter unit, etc. of liquid supply device 11, and some of them may be substituted by the facilities of, e.g., a factory in which exposure apparatus EX is installed.

Liquid recovery device 21 of liquid immersion mechanism 1 is provided with a vacuum system, e.g., a vacuum pump, a gas-liquid separator that separates the recovered liquid LQ from gas, a tank that stores the recovered liquid LQ, etc. To liquid recovery device 21 is connected one end portion of recovery pipe 23, and the other end portion of recovery pipe 23 is connected to nozzle member 70. The liquid recovery operation of liquid recovery device 21 is controlled by controller CONT. By controlling liquid recovery device 21, controller CONT can adjust the per-unit-time liquid recovery amount via collection port 22. It should be noted that exposure apparatus EX need not be supplied with all of the vacuum system, the gas-liquid separator, the tank, etc. of liquid recovery device 21, and some of them may be substituted by the facilities of, e.g., a factory in which exposure apparatus EX is installed.

Supply ports 12, which supplies liquid LQ, and collection port 22, which recovers liquid LQ, are formed in undersurface 70A of nozzle member 70. Undersurface 70A of nozzle member 70 is set substantially parallel to the XY-plane, and the position thereof is set such that when substrate stage PST is placed so as to face projection optical system PL (final optical element LS1), a predetermined gap is formed between the undersurface and top face 97 of substrate stage PST and/or the surface of substrate P. Nozzle member 70 is a ring-shaped member that is provided so as to surround at least the side face of final optical element LS1, and a plurality of supply ports 12 are provided so as to surround, at undersurface 70A of nozzle member 70, final optical element LS1 of projection optical system PL (optical axis AX of projection optical system PL). Furthermore, collection port 22 is, at undersurface 70A of nozzle member 70, provided at a position outside of supply ports 12 relative to final optical element LS1 and is thus provided so as to surround final optical element LS1 and supply ports 12.

It is to be noted that the shape of nozzle member (nozzle mechanism) is not limited to the above-described one, and such a nozzle member (nozzle mechanism) as disclosed in, e.g., PCT International Publication WO 2004/086468 (which corresponds to United States Published Patent Application Publication NO. 2005/0280791A1) or Japanese Unexamined Patent Publication No. 2004-289126 (which corresponds to U.S. Pat. No. 6,952,253) may also be used. More specifically, while, in the embodiment, undersurface 70A of nozzle member 70 is set at substantially the same height (Z-position) as the lower end surface (exit surface) of projection optical system PL, undersurface 70A of nozzle member 70 may, for example, be set at a position nearer to the image plane (substrate) compared with the lower end surface of projection optical system PL. In this case, a portion (lower end portion) of nozzle member 70 may be set to get into the underside of projection optical system PL (final optical element LS1) in a manner that the portion does not block exposure light EL. Furthermore, while, in the embodiment, supply ports 12 are provided in undersurface 70A of nozzle member 70, supply ports 12 may, for example, be provided in the nozzle member 70's internal surface (inclined surface) that faces the side face of final optical element LS1 of projection optical system PL.

Finally, by supplying a predetermined amount of liquid LQ onto substrate P by using liquid supply device 11 and by, at the same time, recovering a predetermined amount of liquid LQ on substrate P by using liquid recovery device 21, controller CONT fills exposure light EL's optical path space K1 between projection optical system PL and substrate P with liquid LQ to locally form on substrate P liquid immersion region LR of liquid LQ. In forming liquid immersion region LR of liquid LQ, controller CONT drives each of liquid supply device 11 and liquid recovery device 21. When liquid LQ is delivered from liquid supply device 11 under control of controller CONT, the liquid LQ delivered from liquid supply device 11 is, after flowing through supply pipe 13, supplied, via the supply flow path of nozzle member 70, from supply ports 12 to optical path space K1 on the image plane side of projection optical system PL. Furthermore, when liquid recovery device 21 is driven under control of controller CONT, liquid LQ on the image plane side of projection optical system PL flows, via collection port 22, into the recovery flow path of nozzle member 70 and, after flowing through recovery pipe 23, is recovered by liquid recovery device 21.

<First Embodiment of Exposure Condition Determination Method>

Next, there will be described a method for determining the exposure condition when by irradiating exposure light EL onto substrate P via liquid LQ of liquid immersion region LR formed on substrate P, substrate P is exposed. In this embodiment, description will be made by assuming, as an example, a case where controller CONT determines the exposure condition. In determining the exposure condition, controller CONT detects (observes), while moving a predetermined object (e.g., substrate P) in a state in which liquid immersion region LR is formed on the surface of the object, the situation of liquid immersion region LR and determines the exposure condition based on the detection results (observation results). In detecting (observing) the situation of liquid immersion region LR, controller CONT, while changing at least one of the movement condition when moving the object and the liquid immersion condition when forming liquid immersion region LR, detects (observes) the situation of liquid immersion region LR by using a predetermined detection device (hereinafter, referred to also as observation device). Furthermore, controller CONT stores the detection results of liquid immersion region LR by the detection device in a memory (storage device), not shown, located in or outside exposure apparatus EX after mapping the detection results on the movement condition and/or the liquid immersion condition at the time of the detection. Furthermore, it is configured such that controller CONT is capable of displaying on a display unit (display), not shown, the detection results or the stored information.

Figure 2:
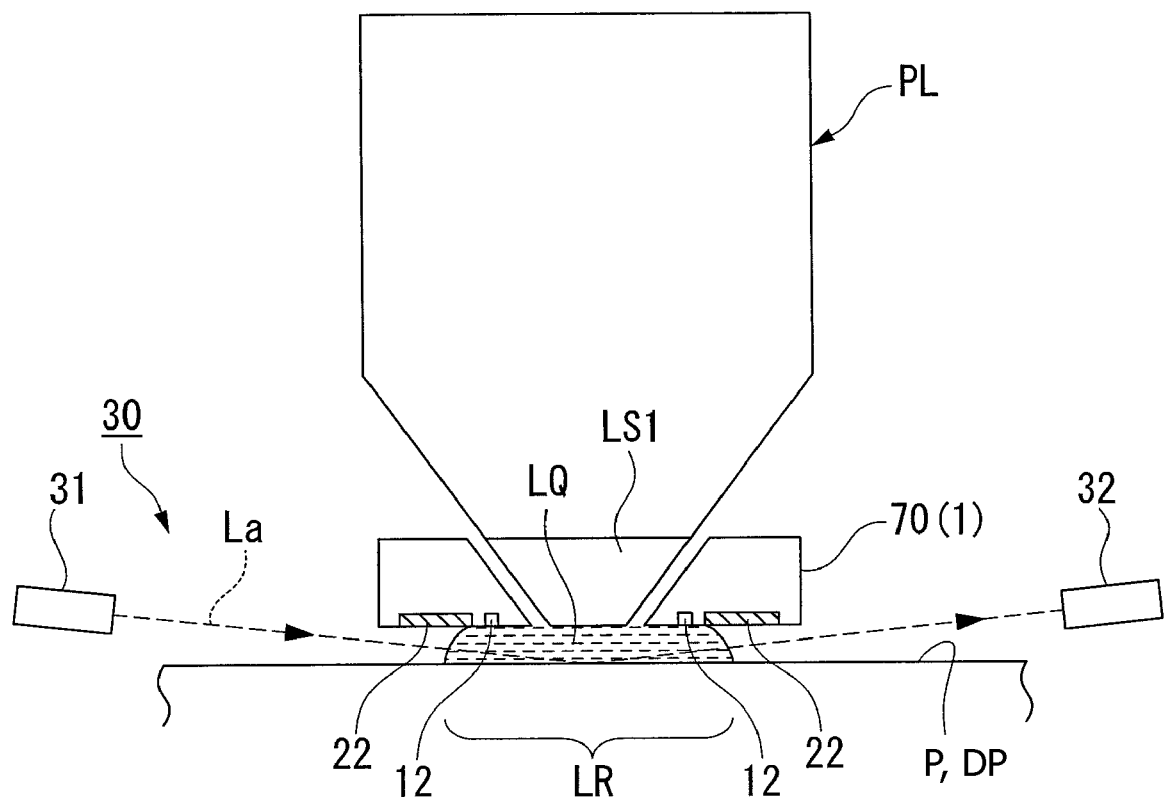
FIG. 2 is a drawing for illustrating a first exposure condition determination method embodiment.

FIG. 2 is a drawing showing the state in which the situation of liquid immersion region LR is being observed by the use of observation device 30. Observation device 30 is for observing the situation of liquid immersion region LR formed on the surface of the predetermined object and, in the embodiment, observes the situation of liquid immersion region LR formed on substrate P for manufacturing devices. When observing the situation of liquid immersion region LR, controller CONT makes substrate stage PST (substrate holder PH) hold substrate P and forms, on the surface of the substrate P held by substrate stage PST, liquid immersion region LR of liquid LQ by using liquid immersion mechanism 1. By filling optical path space K1 between substrate P and final optical element LS1, which faces substrate P and through which exposure light EL passes, with liquid LQ, liquid immersion mechanism 1 forms liquid immersion region LR on substrate P. And, controller CONT, while moving substrate P by driving substrate stage PST in the state in which liquid immersion region LR is formed on the surface of substrate P, observes the situation of liquid immersion region LR by using observation device 30.

In FIG. 2, observation device 30 is provided with projector portion 31 that emits detection light La and with light receiving portion 32 that is set at a predetermined position relative to detection light La and is capable of receiving detection light La. Projector portion 31 is configured such that it irradiates detection light La from an inclined direction relative to the surface of substrate P. Light receiving portion 32 is disposed at a position where it can receive the reflected light of detection light La irradiated on the surface of substrate P by projector portion 31.

Figure 3:
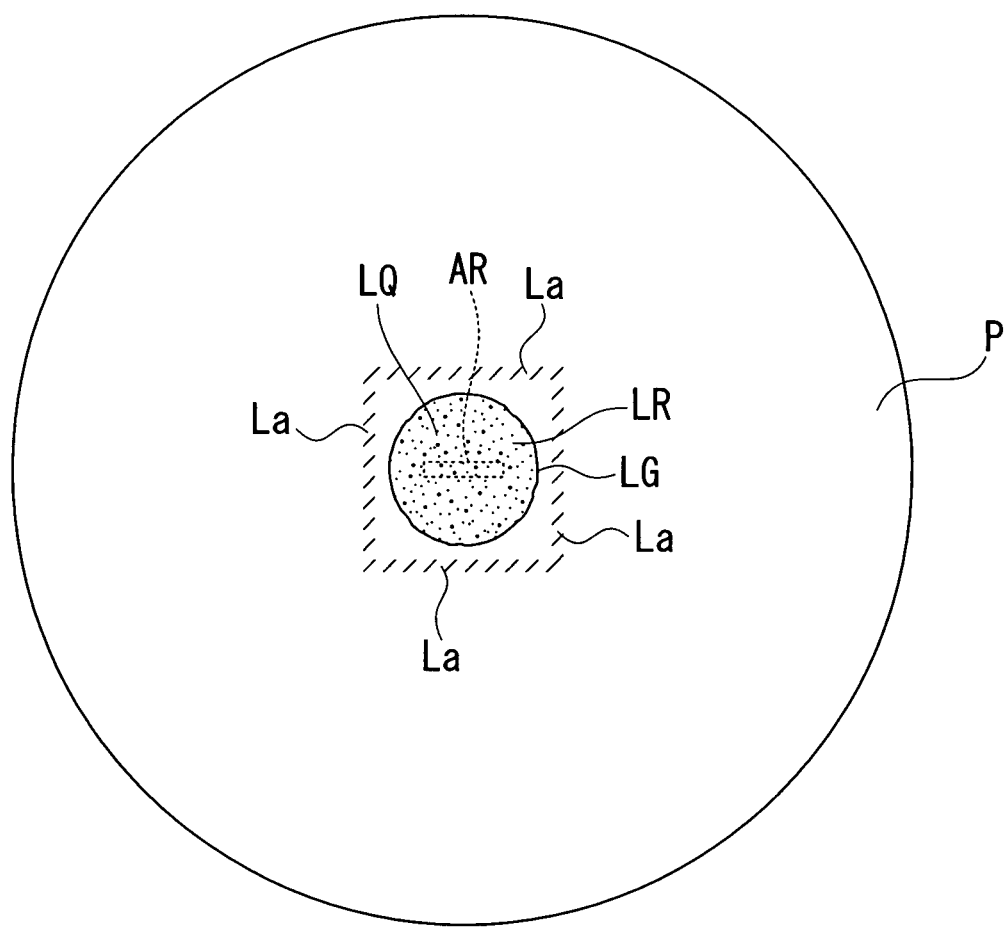
FIG. 3 is a plan view of the substrate in FIG. 2, when viewed from above.
Figure 3:
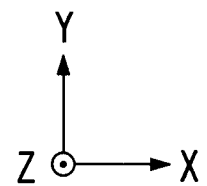

FIG. 3 is a plan view of the surface of substrate P when the situation of liquid immersion region LR is being observed. As shown in FIG. 3, detection light La is irradiated on each of a plurality of predetermined positions on the surface of substrate P. In the embodiment, a plurality of detection lights La emitted from projector portion 31 are irradiated onto the vicinity of edge (end portion) LG of liquid immersion region LR formed on substrate P. Projector portion 31 irradiates detection light La onto each of a plurality of positions on the surface of substrate P in the vicinity of edge LG of liquid immersion region LR so as to surround liquid immersion region LR. In other words, the optical paths of the plurality of detection lights La emitted from projector portion 31 are set so as to surround liquid immersion region LR. It is to be noted that as shown in FIG. 3, in the embodiment, the shape, as viewed from above, of detection light La irradiated onto the surface of substrate P is slit-shaped.

Controller CONT forms, in the state in which detection lights La are being emitted from projector portion 31, liquid immersion region LR on the surface of substrate P. Here, it is configured such that when liquid immersion region LR on substrate P is in a desired condition (desired largeness and shape), each of the plurality of detection lights La is irradiated on a position that is within the surface of substrate P and is separated from liquid immersion region LR's edge LG by a predetermined distance. In other words, each of the plurality of detection lights La emitted from projector portion 31 is set such that when liquid immersion region LR is formed in the desired condition, the light is not irradiated on liquid LQ of liquid immersion region LR and reaches light receiving portion 32 without via liquid LQ. That is, in accordance with the preset, target shape or largeness of liquid immersion region LR, the optical paths (irradiation points on substrate P) of the plurality of detection lights La irradiated in the vicinity of edge LG of liquid immersion region LR are each set.

Thus, when with liquid LQ being not able to be held between final optical element LS1 and substrate P, a portion of liquid LQ filling optical path space K1 leaks, or with liquid immersion region LR becoming larger than the preset, predetermined (desired) largeness, the position of edge LG relative to optical path space K1 changes, liquid LQ comes to enter the optical path area of detection light La. The light receiving condition of light receiving portion 32 when detection light La is irradiated on liquid LQ differs from that when detection light La is not irradiated on liquid LQ. For example, when detection light La is irradiated on liquid LQ, the reflected light cannot be received by light receiving portion 32, or the light receiving position on light receiving portion 32 changes significantly. As a result, observation device 30 can observe the situation of liquid immersion region LR relative to optical path space K1 by using projector portion 31 and light receiving portion 32. And, by observing the position of edge LG of liquid immersion region LR relative to optical path space K1, controller CONT can judge whether liquid LQ has leaked from optical path space K1. In this way, based on the light receiving results of light receiving portion 32 when detection lights La are illuminated by projector portion 31 onto the vicinity of edge LG of liquid immersion region LR, controller CONT can observe the situation of liquid immersion region LR, including the leakage of liquid LQ filling optical path space K1.

Furthermore, since, in the embodiment, the plurality of detection lights La are irradiated so as to surround liquid immersion region LR, controller CONT can observe, based on the light receiving results of light receiving portion 32, the leakage direction of liquid LQ leaking from optical path space K1. It should be noted that, in the embodiment, the plurality of detection lights La are distributed on substrate P in a rectangular form, but, without being limited to this, the detection lights La may, for example, be distributed in substantially the same form as the contour of liquid immersion region LR (in the case of FIG. 3, in a circular form). Furthermore, the shape of detection light La on substrate P is slit-shaped in the embodiment, but, without being limited to this, the shape may be of another type, e.g., of circular form.

It should be noted that detection lights La are not necessarily required to be irradiated so as to surround liquid immersion region LR and may, for example, be irradiated onto only the both sides of liquid immersion region LR relative to the scanning direction (Y-direction).

In order to determine the exposure condition, controller CONT, while moving substrate P by driving substrate stage PST in the state in which liquid immersion region LR is formed on the surface of substrate P by controller CONT by the use of liquid immersion mechanism 1, observes the situation of liquid immersion region LR by using observation device 30. At this time, controller CONT, while changing at least one of the movement condition when moving substrate P and the liquid immersion condition when forming liquid immersion region LR, observes liquid immersion region LR by using observation device 30. Here, the movement condition of substrate P includes at least one of the moving speed, the moving distance, and the moving direction of substrate P. Furthermore, the liquid immersion condition includes at least one of the per-unit-time liquid supply amount from supply ports 12 onto substrate P (optical path space K1) and the per-unit-time liquid recovery amount via collection port 22. Controller CONT can change, by controlling substrate stage driver PSTD, the movement condition of substrate P held by substrate stage PST and can change, by controlling liquid immersion mechanism 1, the liquid immersion condition when forming liquid immersion region LR.

Figure 4:
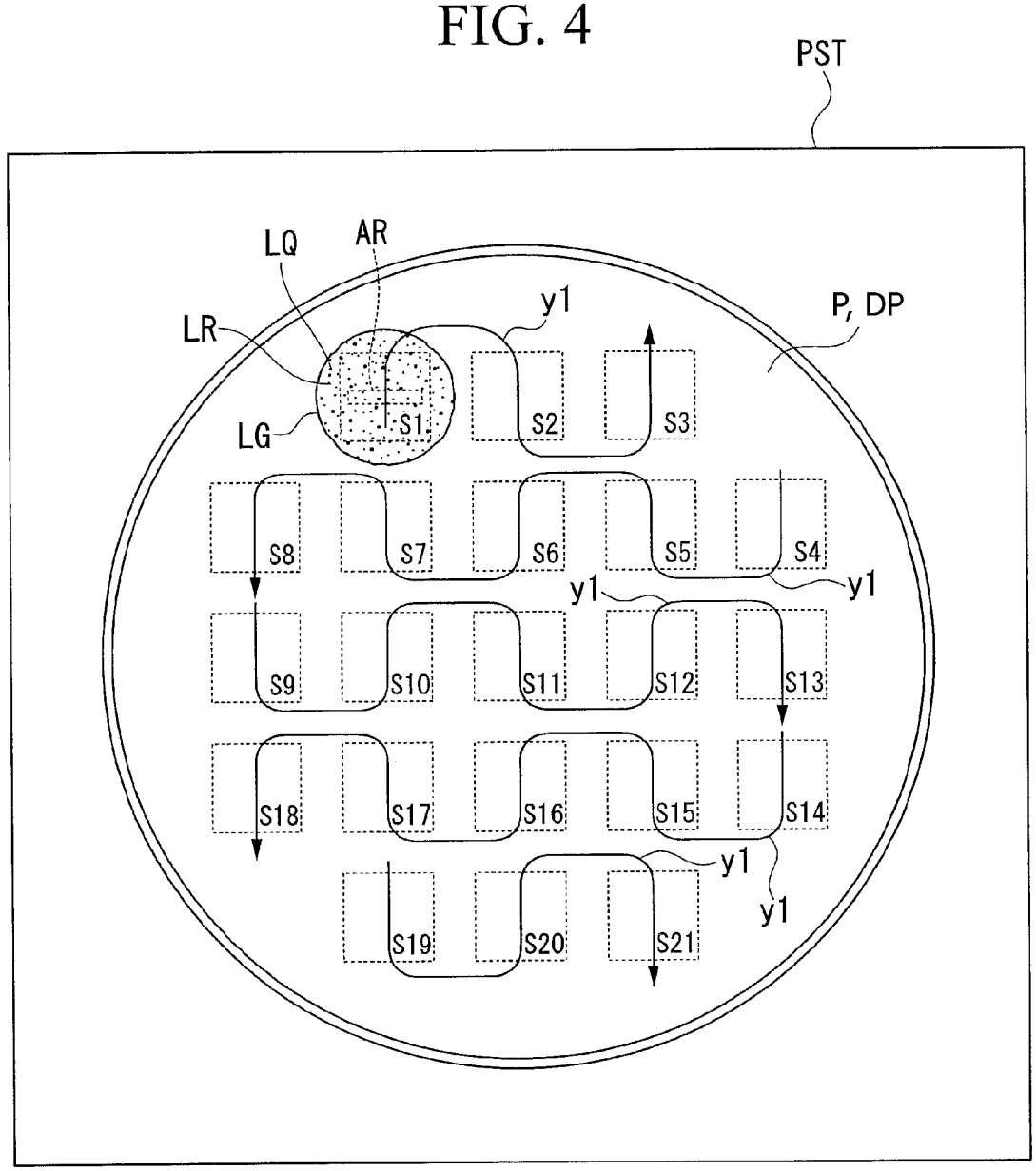
FIG. 4 is a drawing for illustrating a movement condition of a substrate or dummy substrate.

FIG. 4 is a drawing schematically showing a positional relationship between projection optical system PL or liquid immersion region LR and substrate P when substrate P is moved in the state in which liquid immersion region LR is formed on the surface of substrate P. Controller CONT, while relatively moving projection optical system PL's optical axis AX (projection area AR) and substrate P as shown, in FIG. 4, by, e.g., arrow y1, observes the situation of liquid immersion region LR by using observation device 30.

In order to determine the exposure condition, controller CONT, while, under the condition of the movement trajectory as shown by arrow y1 of FIG. 4, changing each of the moving speed when moving substrate P (substrate stage PST) in, e.g., the Y-direction and the per-unit-time liquid supply amount from supply ports 12, observes the situation of liquid immersion region LR by using observation device 30. While, by controlling substrate stage driver PSTD, setting the moving speed of substrate P (substrate stage PST) to each of, e.g., 400, 450, 500, 550, 600, 650, and 700 mm/sec. and, at the same time, by controlling liquid immersion mechanism 1, setting the per-unit-time liquid supply amount from supply ports 12 to each of, e.g., 200, 250, 300, 350, 400, 450, and 500 ml/min., controller CONT observes, under each of the moving speed conditions and the liquid supply amount conditions, the situation of liquid immersion region LR.

Here, the movement trajectory of substrate P (substrate stage PST), as shown by arrow y1 of FIG. 4, is an example of movement trajectories when moving substrate P to manufacture devices, and during the exposure operation on substrate P, each of the plurality of shot areas S1-S21 set in a matrix fashion is exposed. In other words, in the embodiment, in observing liquid immersion region LR in order to determine the exposure condition, controller CONT, while moving substrate P under the same movement trajectory as that when exposing substrate P to manufacture devices and while changing each of the moving speed at that time and the liquid supply amount at that time, observes liquid immersion region LR.

The situation of liquid immersion region LR may change depending upon the moving speed of substrate P (substrate stage PST). For example, when, in the state in which with optical path space K1 between projection optical system PL and substrate P being filled with liquid LQ, liquid immersion region LR is formed on substrate P, the moving speed of substrate P (substrate stage PST) is increased, liquid LQ of liquid immersion region LR may, with liquid LQ being pulled by substrate P which is moving, leak from optical path space K1. Furthermore, in some moving speed conditions, there may occur a situation in which a gas portion is formed in optical path space K1 (hereinafter, referred to as "shortage of liquid"). Furthermore, in some moving speed conditions, air bubbles may be formed in liquid LQ. Meanwhile, from the viewpoint of, e.g., improving the device productivity, it is desirable that the moving speed of substrate P (substrate stage PST) be increased. Given those circumstances, by observing the situation of liquid immersion region LR by the use of observation device 30 while changing the moving speed of substrate P (substrate stage PST), controller CONT can determine a moving speed which is as high as possible and is within the range where such disadvantages as the leakage of liquid LQ or the shortage of liquid does not occur, i.e. an optimum moving speed.

In addition, the situation of liquid immersion region LR may change depending upon the per-unit-time liquid supply amount from supply ports 12. For example, when the per-unit-time liquid supply amount is excessively increased, liquid LQ may leak from optical path space K1. In contrast, when the per-unit-time liquid supply amount is small, the shortage of liquid etc. may occur. Given those circumstances, by observing the situation of liquid immersion region LR by the use of observation device 30 while changing the per-unit-time liquid supply amount from supply ports 12, controller CONT can determine an optimum per-unit-time liquid supply amount under which such disadvantages as the leakage of liquid LQ or the shortage of liquid does not occur.

It is to be noted in such a configuration as in the embodiment where detection lights La are irradiated onto the vicinity of edge LG of liquid immersion region LR, it is difficult to judge whether a shortage of liquid has occurred; however, since, in the embodiment, liquid immersion region LR is formed on the surface of substrate P for manufacturing devices, by holding mask stage MST mask M having a predetermined pattern, by projecting the pattern image of mask M onto substrate P via projection optical system PL and liquid LQ of liquid immersion region LR by illuminating mask M with exposure light EL, and by, after subjecting the substrate P to a development process, observing the pattern form formed on substrate P, it can be judged whether a shortage of liquid has occurred.

Furthermore, it may also be configured such that observation device 30 irradiates detection light La via liquid LQ also onto the object (substrate P) on which liquid immersion region LR is formed and detects a shortage of liquid of liquid immersion region LR. In this case, in contrast to the situation where detection lights La irradiated so as to surround liquid immersion region LR, the situation of liquid immersion region LR can be detected by taking advantage of the fact that when a shortage of liquid occurs to liquid immersion region LR, detection light La cannot be detected via liquid LQ by light receiving portion 32.

Furthermore, in the above, while changing both of the moving speed of substrate P (substrate stage PST) and the per-unit-time liquid supply amount, the observation of liquid immersion region LR is performed; it may also be configured such that the observation of liquid immersion region LR is performed while changing either one of the moving speed of substrate P (substrate stage PST) and the per-unit-time liquid supply amount, and, based on the observation results, either one of the moving speed of substrate P (substrate stage PST) and the per-unit-time liquid supply amount is determined.

Furthermore, as described above, in the movement condition of substrate P (substrate stage PST) is included the moving distance of substrate P (substrate stage PST). And, the situation of liquid immersion region LR may change depending upon the moving distance of substrate P (substrate stage PST). For example, when, in the state in which with optical path space K1 between projection optical system PL and substrate P being filled with liquid LQ, liquid immersion region LR is formed on substrate P, substrate P (substrate stage PST) is moved in a predetermined direction (the Y-direction) relative to optical path space K1, the longer the moving distance of substrate P (substrate stage PST) with respect to the predetermined direction (the Y-direction), the higher the possibility that with holding liquid LQ between projection optical system PL and substrate P becoming more difficult than a case of a shorter moving distance, liquid LQ would leak from optical path space K1 becomes. Given the circumstances, by observing the situation of liquid immersion region LR by the use of observation device 30 while changing the moving distance of substrate P (substrate stage PST) in the predetermined direction (the Y-direction), controller CONT can determine an optimum moving distance condition (e.g., a maximum movable distance) under which such disadvantages as the leakage of liquid LQ does not occur.

Furthermore, as described above, in the movement condition of substrate P (substrate stage PST) is included the moving direction of substrate P (substrate stage PST). And, the situation of liquid immersion region LR may change depending upon the moving direction of substrate P (substrate stage PST). As shown by arrow y1 of FIG. 4, controller CONT moves substrate P (substrate stage PST) relative to projection optical system PL in each of the X-direction, the Y-direction, and in inclined directions relative to the X-direction (the Y-direction), and in some conditions of the moving direction (movement trajectory) of substrate P (substrate stage PST), liquid LQ may leak, a shortage of liquid may occur, or air bubbles may be generated in liquid LQ. Furthermore, depending upon the moving direction (movement trajectory) of substrate P (substrate stage PST), the direction in which liquid LQ leaks from optical path space K1 may change. Given the circumstances, by observing the situation of liquid immersion region LR by the use of observation device 30 while changing the moving direction of substrate P (substrate stage PST), controller CONT can determine an optimum moving direction (movement trajectory) under which such disadvantages as the leakage of liquid LQ does not occur.

Furthermore, as described above, in the liquid immersion condition is included the per-unit-time liquid recovery amount via collection port 22. And, the situation of liquid immersion region LR may change depending upon the per-unit-time liquid recovery amount. For example, when the per-unit-time liquid recovery amount is excessively increased, such disadvantages as a shortage of liquid may occur. In contrast, when the per-unit-time liquid recovery amount is small, liquid LQ may leak from optical path space K1. Given those circumstances, by observing the situation of liquid immersion region LR by the use of observation device 30 while changing the per-unit-time liquid recovery amount via collection port 22, controller CONT can determine an optimum per-unit-time liquid recovery amount.

Finally, after determining an optimum exposure condition including the movement condition and liquid immersion condition based on the observation results by observation device 30, controller CONT exposes, based on the determined exposure condition, substrate P for manufacturing devices. By, while forming liquid immersion region LR on substrate P based on the determined liquid immersion condition and while moving substrate P based on the determined movement condition, irradiating exposure light EL onto substrate P via projection optical system PL and liquid LQ of liquid immersion region LR, controller CONT exposes substrate P.

As described above, depending upon the movement condition of substrate P and/or the liquid immersion condition when forming liquid immersion region LR, the situation of liquid immersion region LR, including, e.g., the leakage of liquid LQ and/or shortage of liquid, may change; however, since it is configured such that while changing the movement condition of substrate P and/or the liquid immersion condition when forming liquid immersion region LR, the situation of liquid immersion region LR is observed by the use of observation device 30, and based on the observation results, the exposure condition including the movement condition of substrate P and the liquid immersion condition is determined, substrate P can be exposed well by exposing substrate P based on the determined exposure condition, with such disadvantages as the leakage of liquid LQ and the shortage of liquid being suppressed.

It is to be noted that observation device 30 of the embodiment can be utilized as an oblique-incidence type focus-leveling detection system that detects the surface position information of the surface of substrate P. In other words, when observing liquid immersion region LR in order to determine the exposure condition, an oblique-incidence type focus-leveling detection system can be used.

<Second Embodiment of Exposure Condition Determination Method>

Next, a second embodiment will be described. Note that since, in this embodiment, the configuration of the observation device differs from that of the above-described embodiment, only the observation device will be described hereinafter, and with respect to the same or equivalent constituent elements as those in the above-described embodiment, their descriptions will be abridged or omitted.

Figure 5:
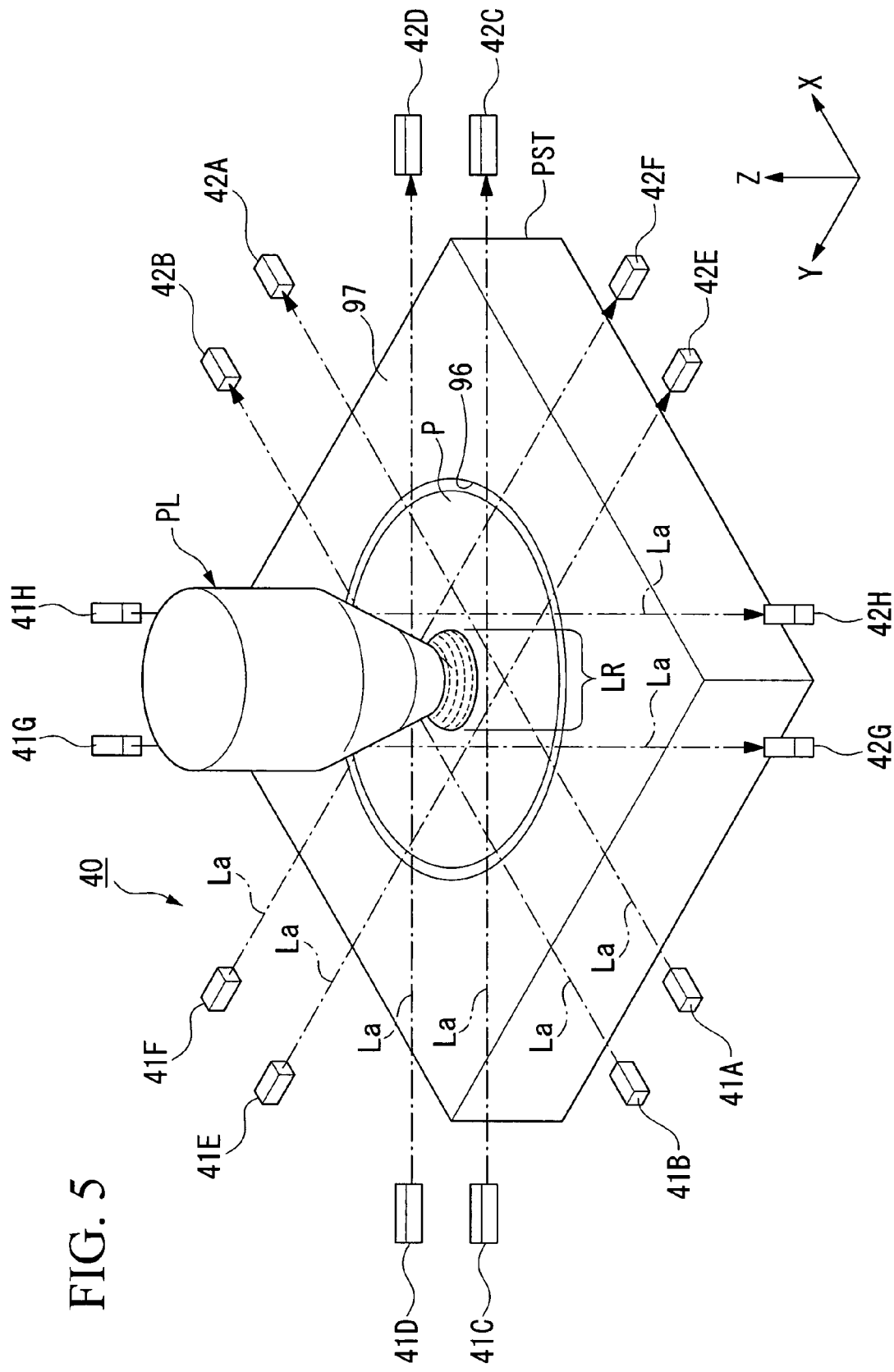
FIG. 5 is a drawing for illustrating a second exposure condition determination method embodiment.

FIG. 5 is a perspective view showing the second embodiment. As shown in FIG. 5, observation device 40 is provided with a plurality of projector portions 41A-41H disposed outside substrate stage PST and with a plurality of light receiving portions 42A-42H disposed so as to correspond to projector portions 41A-41H. Projector portions 41A-41H and light receiving portions 42A-42H are fixed on, e.g., a predetermined fixing member provided in a position separated from substrate stage PST.

In observation device 40, detection light La that is nearly parallel to the XY-plane, i.e., nearly parallel to the surface of substrate P and top face 97 of substrate stage PST is emitted from each of projector portions 41A-41H. The plurality of detection lights La, each emitted from projector portions 41A-41H, are irradiated onto the vicinity of edge LG of liquid LQ's liquid immersion region LR formed on substrate P. By those projector portions 41A-41H, observation device 40 irradiates detection light La, from a plurality of directions different from each other, onto each of a plurality of positions in the vicinity of edge LG of liquid immersion region LR. More specifically, among projector portions 41A-41H provided in plurality, projector portions 41A and 41B irradiate detection lights La, from a direction nearly parallel to the X-axis-direction, onto the vicinity of edge LG of liquid immersion region LR, and projector portions 41E and 41F irradiate detection lights La from a direction nearly parallel to the Y-axis-direction. Furthermore, projector portions 41C and 41D irradiate detection lights La, from an inclined direction relative to the X-axis- (the Y-axis-) direction, onto the vicinity of edge LG of liquid immersion region LR, and projector portions 41G and 41H irradiate detection lights La from an inclined direction different from that of the detection lights La emitted from projector portions 41C and 41D. In other words, the optical paths of the plurality of detection lights La, each emitted from projector portions 41A-41H, are set so as to surround the periphery of liquid immersion region LR.

Furthermore, the two detection lights La, each emitted from each of projector portions 41A and 41B, are provided so that they are irradiated on each of the vicinities on the both sides of liquid immersion region LR, with liquid immersion region LR being located between them. Similarly, the two detection lights La, each emitted from each of projector portions 41C and 41D, are provided so that they are irradiated on each of the vicinities on the both sides of liquid immersion region LR; the two detection lights La, each emitted from each of projector portions 41E and 41F, are provided so that they are irradiated on each of the vicinities on the both sides of liquid immersion region LR; the two detection lights La, each emitted from each of projector portions 41G and 41H, are provided so that they are irradiated on each of the vicinities on the both sides of liquid immersion region LR.

When liquid immersion region LR on substrate P is in a desired condition (desired largeness and shape), the optical paths of detection lights La are set at a position outside and separated from liquid immersion region LR's edge LG by a predetermined distance. In other words, each of the plurality of detection lights La emitted from projector portions 41A-41H is set such that when liquid immersion region LR is formed in the desired condition, the light is not irradiated on liquid LQ of liquid immersion region LR and reaches each of light receiving portions 42A-42H without via liquid LQ.

Furthermore, since, among the plurality of detection lights La, each of the paired (two) detection lights La that are irradiated from the same direction are each irradiated onto each of the vicinities of edge LG on the both sides of liquid immersion region LR and since, in the embodiment, the plurality of optical paths of detection light La are set so as to surround liquid immersion region LR, the leakage direction of liquid LQ flowing out from liquid immersion region LR can also be detected.

Based on the light receiving results of light receiving portions 42A-42H, controller CONT can observe the situation of liquid immersion region LR, including the leakage of liquid LQ. By observing liquid immersion region LR by the use of observation device 40 while changing at least one of the movement condition when moving substrate P (substrate stage PST) and the liquid immersion condition when forming liquid immersion region LR, controller CONT can determine an optimum exposure condition, based on the observation results.

It is to be noted in such a configuration as in the embodiment where detection lights La are irradiated onto the vicinity of edge LG of liquid immersion region LR, it is difficult to judge whether a shortage of liquid has occurred; however, for example, by irradiating, substantially parallel to substrate P, at least one detection light La different from the above-described plurality of detection lights La or a part of the plurality of detection lights La onto optical path space K1 between projection optical system PL and substrate P, it can be observed, based on the light receiving results from a light receiving portion provided in correspondence to the detection light La, whether a shortage of liquid has occurred. Furthermore, it is configured in the embodiment such that a pair of detection lights La are irradiated onto substrate P from each the four directions different from each other, including the X-axis- and Y-axis-directions; however, without being limited to this, a pair of detection lights La may be irradiated from each of less than four directions or of more than five directions, and those directions are not necessarily required to include the X-axis-direction or the Y-axis-direction. Furthermore, the number of detection lights La irradiated from a same direction is not limited to two, but may be one or more than two.

<Third Embodiment of Exposure Condition Determination Method>

Figure 6:
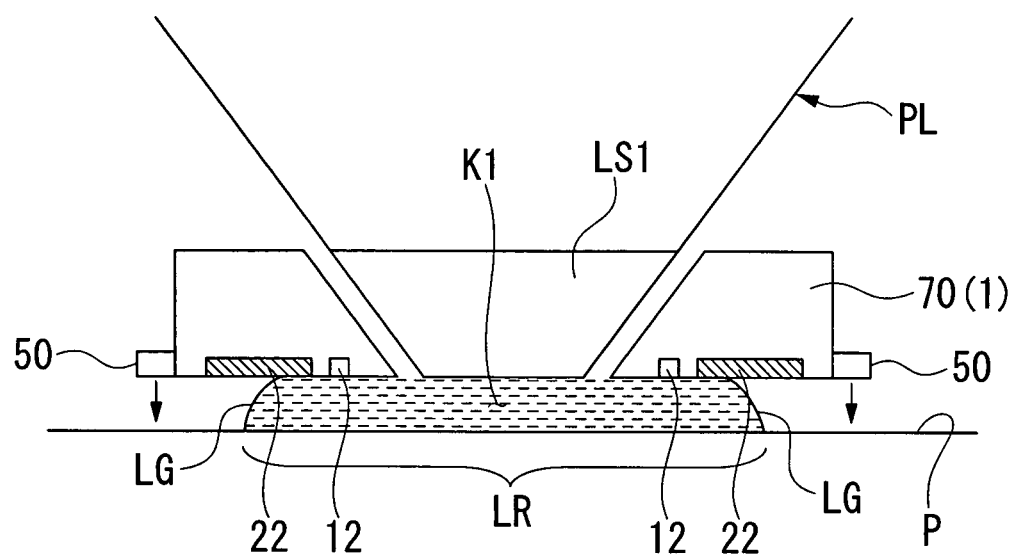
FIG. 6 is a drawing for illustrating a third exposure condition determination method embodiment.

Next, a third embodiment will be described referring to FIG. 6. Note that since, in this embodiment, the configuration of the observation device differs from that of each of the above-described embodiments, only the observation device will be described hereinafter, and the same or equivalent constituent elements as those in each of the above-described embodiments will be denoted by the same reference numerals, and their descriptions will be omitted. In FIG. 6, on the side face of nozzle member 70 are provided imaging devices 50 as observation devices. Imaging devices 50 are provided so as to face substrate P and are capable of observing the position of liquid immersion region LR's edge LG relative to optical path space K1. Imaging devices 50 are provided in plurality along the circumferential direction of the side face of nozzle member 70.

Based on the imaging results of imaging devices 50, controller CONT can observe the situation of liquid immersion region LR, including the leakage of liquid LQ. By imaging liquid immersion region LR by the use of imaging devices 50 while changing at least one of the movement condition when moving substrate P (substrate stage PST) and the liquid immersion condition when forming liquid immersion region LR, controller CONT can observe the situation of liquid immersion region LR. And, controller CONT can determine an optimum exposure condition, based on the observation results.

It should be noted that imaging devices 50 are fixed to nozzle member 70, but, without being limited to this, they may be fixed to another member, e.g., a supporting member that supports projection optical system PL.

Furthermore, in the first to third embodiments, in determining the exposure condition, liquid immersion region LR is formed on substrate P for manufacturing devices. Depending upon the surface condition of the object on which liquid immersion region LR is formed, the situation of liquid immersion region LR may change. Here, the condition of the object includes the contact angle condition of the surface of the object relative to liquid LQ. When the surface condition of the object on which liquid immersion region LR is formed when determining the exposure condition differs from the surface condition of substrate P on which liquid immersion region LR is formed when performing exposure for manufacturing devices, there arises the possibility that the situation of liquid immersion region LR during liquid immersion exposure of substrate P cannot be kept in a desired condition, even if substrate P is liquid immersion exposed based on the determined exposure condition. Thus, in determining the exposure condition, by forming liquid immersion region LR on substrate P for manufacturing devices (or a substrate having an equivalent surface condition) and by determining the exposure condition based on the observation results obtained by observing the liquid immersion region LR, an optimum exposure condition can be determined.

It should be noted that when the surface condition of an object on which liquid immersion region LR is formed when determining the exposure condition is substantially equivalent to the surface condition of substrate P on which liquid immersion region LR is formed when performing exposure for manufacturing devices, an optimum exposure condition can be determined based on the observation results of the situation of liquid immersion region LR formed on the object. Thus, an optimum exposure condition can be determined based on the observation results obtained by observing the situation of liquid immersion region LR formed on the surface of an object having a surface condition substantially equivalent to the surface condition of substrate P. As an example of such an object, there can be listed a dummy substrate DP of which surface condition is set to be substantially equal to the surface condition of substrate P and which can be held by substrate stage PST (substrate holder PH). Alternatively, it may also be configured such that a portion of top face 97 of substrate stage PST is set to have a surface condition substantially equivalent to the surface of substrate P, and liquid immersion region LR formed on the portion of top face 97 is observed.

Furthermore, in the above-described first to third embodiments, in detecting the situation of liquid immersion region LR, it may be configured such that in the midst of moving an object (e.g., substrate P) on which surface is formed liquid immersion region LR so that its movement trajectory becomes arrow y1 shown in FIG. 4, at least one of the movement condition of the substrate P and the liquid immersion condition when forming liquid immersion region LR is changed, but it may also be configured such that after moving substrate P along the movement trajectory, at least one of the movement condition and the liquid immersion condition is changed, and then under the changed condition, substrate P is again moved along the movement trajectory. The latter configuration is applied to the situation in which depending upon the position (shot area) on substrate P, the optimum exposure condition may vary. In this case, it may be configured such that the situation of liquid immersion region LR is detected over the full range of the movement trajectory, but it may also be configured, for example, such that the situation of liquid immersion region LR is detected only with respect to a part of the movement trajectory (a part of shot areas S1-S21) where the optimum exposure condition with respect to that part is expected to differ from that with respect to the other parts. In addition, in detecting the situation of liquid immersion region LR, substrate P is not necessarily required to be moved along the movement trajectory, and it may also be configured, for example, such that substrate P is moved so that shot areas in the vicinity of the center of substrate P and shot areas in the vicinity of the periphery of substrate P where a portion of liquid immersion region LR runs off to the outside of the substrate are moved relatively to projection area AR (liquid immersion region LR).

Furthermore, in the above-described first to third embodiments, it is configured such that an object (substrate P, a dummy substrate DP, etc.) on which surface is formed liquid immersion region LR is placed on substrate stage PST, but it may also be configured such that with the object being placed on a movable (e.g., the measurement stage described below) different from substrate stage PST, the situation of liquid immersion region LR is detected. Still further, in the above-described first to third embodiments, it is assumed that a plurality of detection lights La or imaging devices 50 are used, but the number thereof is not limited to that described above, and the number thereof may be set arbitrarily and may even be set to be 1.

<Fourth Embodiment of Exposure Condition Determination Method>

Figure 7:
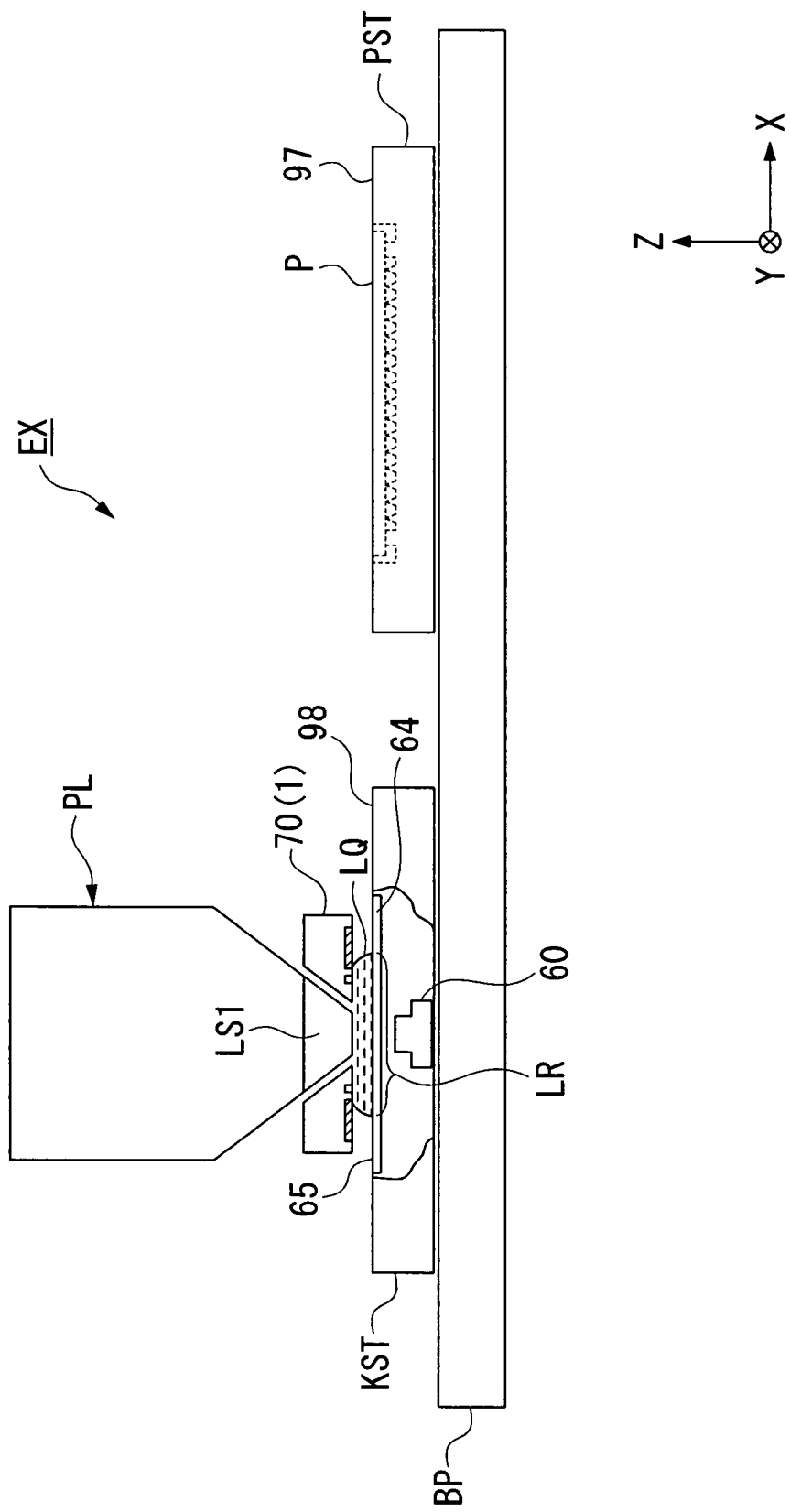
FIG. 7 is a drawing for illustrating a fourth exposure condition determination method embodiment.

Next, a fourth embodiment will be described referring to FIG. 7. Note that since this embodiment differs from each of the above-described embodiments in that an observation device is provided to measurement stage KST which is separate from substrate stage PST, only the observation device will be described hereinafter, and the same or equivalent constituent elements as those in each of the above-described embodiments will be denoted by the same reference numerals, and their descriptions will be omitted. Exposure apparatus EX shown in FIG. 7 is provided with substrate stage PST which holds substrate P and with measurement stage KST which is equipped with measuring instruments that performs measurements related to the exposure process and which is movable independently of substrate stage PST. On measurement stage KST are mounted a fiducial member on which a fiducial mark is formed and various kinds of photoelectric sensors. And, measurement stage KST is provided with observation device 60 which is capable of observing the situation of liquid immersion region LR. Observation device 60 is provided inside measurement stage KST. It is to be noted that measurement stage KST is detailed in, e.g., Japanese Unexamined Patent Publication No. H11-135400 (which corresponds to PCT International Publication WO 1999/23692) and Japanese Unexamined Patent Publication No. 2000-164504 (which corresponds to U.S. Pat. No. 6,897,963).

Figure 8:
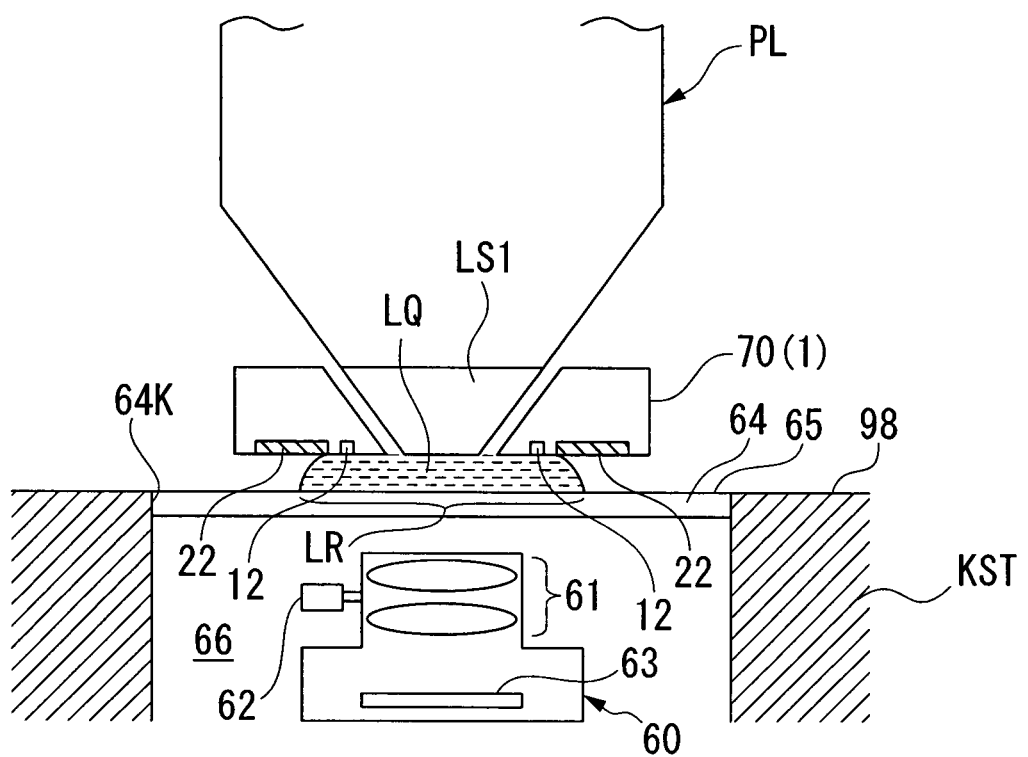
FIG. 8 is an enlarged cross sectional view showing the main part of FIG. 7.

FIG. 8 is a cross sectional view showing observation device 60 and its vicinity. In FIG. 8, on measurement stage KST is formed opening portion 64K, and in opening portion 64K is disposed transparent member 64. Transparent member 64 is constituted by, e.g., a glass plate. Upper surface 65 of transparent member 64 is a flat surface. Furthermore, top face 98 of measurement stage KST, which is other than opening portion 64K, is also a flat surface. And, top face 98 of measurement stage KST and upper surface 65 of transparent member 64 disposed in opening portion 64K are provided so that they have substantially the same height (constitute the same plane), and top face 98 of measurement stage KST is configured such that it includes upper surface 65 of transparent member 64. And, top face 98 of measurement stage KST and upper surface 65 of transparent member 64 have substantially the same surface condition (contact angle) as substrate P. It is to be noted that it may also be configured such that only a portion of top face 98 of measurement stage KST, e.g., only a predetermined region (including the area where liquid immersion region LR is formed) surrounding transparent member 64, is made to have the same height as upper surface 65 of transparent member 64. Furthermore, it may also be configured such that at least a portion of measurement stage KST's top face 98, which has the same height as upper surface 65 of transparent member 64, does not have substantially the same surface condition as substrate P. In this case, it may also be configured such that transparent member 64, of which upper surface 65 has substantially the same surface condition as substrate P, has a size comparable to or larger than liquid immersion region LR.

Measurement stage KST's top face 98 including upper surface 65 of transparent member 64 and substrate stage PST's top face 97 can be disposed so that they substantially the same height position (Z-position). Although not shown, the position information of measurement stage KST in the six-degree-of-freedom directions (X-axis-, Y-axis-, Z-axis, θX-, θY-, and θZ-directions) can be measured by, e.g., a laser interferometer.

In measurement stage KST is formed inner space 66 that connects to opening portion 64K. Observation device 60 is disposed in inner space 66 of measurement stage KST. Observation device 60 is provided with optical system 61 disposed under transparent member 64 and with imaging device 63 constituted by, e.g., a CCD. Imaging device 63 can obtain the optical image (image) of liquid immersion region LR via transparent member 64 and optical system 61. Imaging device 63 converts the obtained image into electrical signals and outputs the signals (image information) to controller CONT. Furthermore, observation device 60 has adjustment mechanism 62 that is capable of adjusting the focus position of optical system 61. Still further, observation device 60 has a field of view through which the entirety of liquid immersion region LR can be observed. As just described, observation device 60 can observe the situation of liquid immersion region LR via transparent member 64 from under liquid immersion region LR. It should be noted that it may be configured such that the entirety of observation device 60 is disposed inside measurement stage KST, but it may also be configured, for example, such that some of the optical elements among a plurality of optical elements constituting optical system 61 and/or imaging device 63 or the like are disposed outside measurement stage KST. Furthermore, it may also be configured such that adjustment mechanism 62 is omitted.

While, in the state in which liquid immersion region LR is formed on upper surface 65 of transparent member 64, moving transparent member 64 (measurement stage KST), controller CONT observes the situation of liquid immersion region LR by using observation device 60. For example, while making measurement stage KST perform a scanning operation in a pseudo-manner, controller CONT observes the situation of liquid immersion region LR by the use of observation device 60. In this embodiment, observation device 60 observes the situation of liquid immersion region LR from under it via transparent member 64 and thus can observe the leakage of liquid LQ, the shortage of liquid, and air bubbles generated in liquid LQ. While changing at least one of the movement condition when moving transparent member 64 (measurement stage KST) and the liquid immersion condition when forming liquid immersion region LR, controller CONT images liquid immersion region LR by using imaging device 63 and can observe the situation of liquid immersion region LR based on the imaging results. Finally, controller CONT can determine an optimum exposure condition based on the observation results.

It should be noted that in the embodiment, before detecting the situation of liquid immersion region LR, it may be configured such that after, in exchange of substrate stage PST, disposing measurement stage KST so as to face projection optical system PL, optical path space K1 between final optical element LS1 and transparent member 64 is filled with liquid LQ to form liquid immersion region LR, or it may be configured such that in a state in which substrate stage PST on top face 97 (including the surface of substrate P) of which is formed liquid immersion region LR and measurement stage KST are made in contact with each other (or made to near each other), both of the stages are driven in a predetermined direction, and liquid immersion region LR is moved from substrate stage PST to measurement stage KST while keeping (holding) liquid immersion region LR between projection optical system PL's final optical element LS1 (and nozzle member 70) and the stages. In the latter case, it is preferable that in a state in which substrate stage PST's top face 97 is set at substantially the same height (Z-position) as measurement stage KST's top face 98, liquid immersion region LR is moved.

Furthermore, in the embodiment, observation device 60 is not limited to an imaging system. Still further, in the embodiment, without providing observation device 60 to measurement stage KST, only making at least a portion of top face 98 of measurement stage KST have substantially equivalent surface condition to that of substrate P would suffice. In this case, after disposing measurement stage KST so as to face projection optical system PL and forming liquid immersion region LR on top face 98 thereof, observing the situation of liquid immersion region LR by using an observation device disclosed in either one of the above-described first to third embodiments would suffice. Furthermore, it may also be configured such that a plurality of regions having different surface conditions are set on top face 98 of measurement stage KST. Furthermore, it can be configured such that by applying a coating on top face 98 of measurement stage KST or by providing the above-mentioned dummy substrate DP or transparent member 64 to measurement stage KST, at least a portion of top face 98 of measurement stage KST is made to have substantially equivalent surface condition to that of substrate P.

It is to be noted that observation device 60 may be provided alternatively to substrate stage PST. Furthermore, since, as described above, there is the possibility that depending upon the contact angle of liquid LQ at the object surface where liquid immersion region LR is formed, the situation of liquid immersion region LR changes, it may also be configured such that while, with transparent members 64 being exchanged, changing the liquid LQ's contact angle relative to the transparent member, the situation of liquid immersion region LR is observed. This would effectively work when exposing each of substrates P having different surface conditions; for that purpose, it can be configured such that in order to determine in advance an optimum exposure condition for each exposure operation for each different substrate, the situation of liquid immersion region LR is detected, with transparent member 64 having substantially equivalent surface condition to that of that particular substrate being exchangedly used.

It should be noted that while, in each of the above-described embodiments, controller CONT determines an optimum exposure condition based on the observation device's observation results stored in the above-mentioned memory, it may also be configured such that an optimum exposure condition is determined by, e.g., an operator based on the observation device's observation results. For example, it may be configured such that the observation device's observation results are displayed on the display unit, and the operator determines an optimum exposure condition based on the display results.

Furthermore, it may also be configured such that when controller CONT is not able to determine an optimum exposure condition or when an optimum exposure condition determined by controller CONT is abnormal, it may be configured, for example, such that a warning is displayed on the display unit. Furthermore, in each of the above-described embodiments, when an optimum exposure condition is determined by detecting the situation of liquid immersion region LR while changing the above-described movement condition, in particular, the moving speed of substrate P (the scanning speed of the substrate at the time of scanning exposure), the determined exposure condition (including the scanning speed) may differ from the initial values set within controller CONT. In this case, it is preferable that the exposure dose amount control is performed so that the exposure dose amount by the scanning exposure for each shot area on the substrate becomes optimum, by adjusting, based on the determined exposure condition (in particular, the scanning speed), at least one of the intensity of exposure light EL, the oscillation frequency of exposure light EL, and the width of projection area AR in the scanning direction (the Y-direction).

It is to be noted that in each of the above-described embodiments, it is configured such that information relating to at least one of the leakage of liquid LQ filling optical path space K1 (i.e., the presence of leakage of liquid LQ and/or the direction of leakage), the shortage of liquid, and air bubbles in liquid LQ, as the situation of liquid immersion region LR, but, without being limited to these, it may also be configured such that at least one of, for example, the position, the size, and the shape of liquid immersion region LR is detected instead of the information or together with the information.

Furthermore, it may also be configured, in each of the above-described embodiments, such that acceleration is included in the above-described movement condition or such that the flow speed, the pressure, etc. of liquid LQ at the time of supply and/or recovery are included in the above-described liquid immersion condition.

Furthermore, when, in each of the above-described first to fourth embodiments, a gas jetting mechanism (gas seal mechanism) for suppressing the leakage of liquid LQ is provided, as disclosed in, e.g., Japanese Unexamined Patent Publication No. 2004-289126 (which corresponds to U.S. Pat. No. 6,952,253), it may be configured such that while changing, as the liquid immersion condition, the flow rate and/or flow speed of the gas to be jetted, the situation of liquid immersion region LR is observed by the observation device.

As described above, in each of the above-described embodiments, liquid LQ is purified water. Purified water has the advantage that it is easily available in bulk in, e.g., semiconductor manufacturing factories and also the advantage that it does not adversely affect photoresist on substrate P, optical elements (lenses), etc. Furthermore, purified water does not adversely affect the environment and contains scarcely any impurities; thus, the effect that it cleans the surface of substrate P and the surface of the optical element provided at the end portion of projection optical system PL can be expected. It should be noted that when the purity of the purified water supplied from, e.g., the factory, it may be configured such that the exposure apparatus itself has an ultrapure water system.

The refractive index n of purified water (water) relative to exposure light EL having a wavelength of about 193 nm is said to be approximately 1.44, and when ArF excimer laser light (having 193 nm wavelength) is used as the light source of exposure light EL, the wavelength is effectively shortened, on substrate P, as if multiplied by 1/n, i.e., effectively becomes approximately 134 nm, and thus, a high resolution can be obtained. Furthermore, since the depth of focus increases by approximately n times, i.e., approximately by 1.44 times, compared with that in the air, when securing of the depth of focus on par with the depth of focus realized when the projection optical system is used in the air suffices, the numerical aperture of the projection optical system PL can be further increased; which also improves the resolution.

In each of the above-described embodiments, optical element LS1 is attached to the end of projection optical system PL, and by this lens, the optical characteristics of projection optical system PL (spherical aberration, coma aberration, etc.) can be adjusted. It should be noted that as the optical element to be attached to the end of projection optical system PL, an optical plate (e.g., cover plate) used for the adjustment of the optical characteristics of projection optical system PL may be utilized. Alternatively, a plane parallel plate that can transmit exposure light EL may be utilized.

It should be noted that if the pressure, caused by the flow of liquid LQ, of the space between the optical element located at the end of projection optical system PL and substrate P is high, it may be configured such that the optical element is rigidly fixed so as not to move due to the pressure, instead of making the optical element replaceable. It should also be noted that the structure of liquid immersion mechanism 1 including nozzle member 70 should not be limited to the above-described structure, and such a structure as disclosed in, e.g., European Patent Application Publication No. 1420298, PCT International Publication WO 2004/055803, PCT International Publication WO 2004/057590, or PCT International Publication WO 2005/029559 may be used.

It should be noted that while, in each of the above-described embodiments, the space between projection optical system PL and the surface of substrate P is filled with liquid LQ, it may be configured, for example, such that in a state that a cover glass constituted by a plane parallel plate is attached to the surface of substrate P, at least the space between the cover glass's surface and projection optical system PL is filled with liquid LQ.

Furthermore, it should be noted that while in the projection optical system of the above-described embodiments, the image plane side optical path space on the optical element located at the end of the projection optical system (LS1) is filled with the liquid, a projection optical system in which the mask side optical path space on the optical element located at the end of the projection optical system is also filled with a liquid, as disclosed in the PCT International Publication WO 2004/019128, may be adopted.

It should be noted that while, in each of the above-described embodiments, liquid LQ is water (purified water), liquid LQ may be a liquid other than water. For example, when the light source of exposure light EL is an $F_2$ laser, the $F_2$ laser light does not transmit through water, and thus, as liquid LQ, a fluorofluid that can transmit the $F_2$ laser light, such as perfluoropolyether (PFPE) or fluorochemical oil, may be used. In this case, the portions that come into contact with liquid LQ are applied with lyophilic treatment, by forming a thin film of a substance which includes, e.g., fluorine and has a molecular structure of a small polarity. Furthermore, as liquid LQ, a material (e.g., cedar oil) that can transmit exposure light EL, has a high refractive index as high as practicable, and does not affect projection optical system PL and the photoresist applied to the surface of substrate P can also be used.

Furthermore, as liquid LQ, a liquid having a refractive index of about 1.6 to 1.8 may also be used. Furthermore, final optical element LS1 may also be formed by a material having a higher refractive index (e.g., equal to or more than 1.6) than quartz or fluorite. As liquid LQ, various kinds of liquids, e.g., a supercritical liquid, may be used. Furthermore, it may also be configured such that, in each of the above-described embodiments, liquid LQ having substantially the same temperature as that of substrate P is supplied to form liquid immersion region LR. By this, for example, substrate P's thermal deformation due to temperature difference between substrate P and liquid LQ can be prevented.

It is to be noted that while, in each of the above-described embodiments, it is configured such that by using the interferometer systems (92, 94, etc.), the position information of each of mask stage MST, substrate stage PST, and measurement stage KST is measured, but, without being limited to this, for example, an encoder system in which a scale (diffraction grating) provided to each stage is detected may also be used. In this case, preferably, a hybrid system in which the interferometer system and the encoder system are both provided is constructed, and by using the measurement results from the interferometer system, the measurement results from the encoder system are calibrated. Furthermore, it may also be configured such that the position control of the stages is performed with both of the interferometer system and the encoder system being exchangeably used or with both of the system being used.

It is to noted that regarding substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), etc. can be used.

Regarding exposure apparatus EX, in addition to a scan type exposure apparatus (scanning stepper) in which while synchronously moving mask M and substrate P, the pattern of mask M is scan-exposed, a step-and-repeat type projection exposure apparatus (stepper) in which the pattern of mask M is exposed at one time in the condition that mask M and substrate P are stationary, and substrate P is successively moved stepwise can be used.

Furthermore, regarding exposure apparatus EX, the present invention can be applied to an exposure apparatus in which in the state that a first pattern and substrate P are substantially stationary, the reduction image of the first pattern is exposed at one time by using a projection optical system (e.g., a refraction type projection optical system that has a reduction magnification of ⅛ and includes no reflecting element). In this case, the present invention can be applied to a stitch type one-shot exposure apparatus in which thereafter, in the state that a second pattern and substrate P are substantially stationary, the reduction image of the second pattern is exposed at one time onto substrate P by using the projection optical system in a manner that the first pattern image and the second pattern image partially overlap with each other. Furthermore, in conjunction with the stitch type exposure apparatus, the present invention can also be applied to a step-and-stitch type exposure apparatus in which at least two patterns are transferred onto substrate P in a partially overlapping manner, and substrate P is successively moved. Also in exposure apparatuses of those types, an optimum exposure condition in performing liquid immersion exposure can be effectively determined in accordance with the present invention.

Furthermore, while, in each of the above-described embodiments, the present invention has been described by assuming, as an example, the exposure apparatus provided with projection optical system PL, an exposure apparatus and an exposure method in which projection optical system PL is not used can also be applied to the present invention. Even in the case where, as just described, projection optical system PL is not used, the exposure light is irradiated onto a substrate via an optical member, e.g., a lens, and a liquid immersion region is formed in a predetermined space between such an optical member and the substrate.

Furthermore, the present invention can also be applied to a twin stage type exposure apparatus that is provided with a plurality of substrate stages, as disclosed in, e.g., Japanese Unexamined Patent Publication No. H10-163099 and Japanese Unexamined Patent Publication No. H10-214783 (which correspond to U.S. Pat. No. 6,590,634), Published Japanese Translation No. 2000-505958 of the PCT International Publication (which corresponds to U.S. Pat. No. 5,969,441), or U.S. Pat. No. 6,208,407. In this case, it may be configured such that by using each of the plurality of substrate stages, the liquid immersion region condition is detected to determine an optimum exposure condition or such that by using a part of the plurality of substrate stages, the liquid immersion region condition is detected to determine an optimum exposure.

Furthermore, while, in each of the above-described embodiments, the exposure apparatus, in which the liquid locally fills the space between projection optical system PL and substrate P, is adopted, the present invention can also be applied to a liquid immersion exposure apparatus in which the entire surface of a substrate to be exposed is immersed in a liquid, as disclosed in, e.g., Japanese Unexamined Patent Publication No. H6-124873, Japanese Unexamined Patent Publication No. H10-303114, or U.S. Pat. No. 5,825,043.

Regarding the type of exposure apparatus EX, the present invention is not limited to an exposure apparatus, which exposes a semiconductor pattern onto substrate P, for manufacturing semiconductor devices, but can also be applied to a variety of exposure apparatuses, e.g., an exposure apparatus for manufacturing liquid crystal display devices or displays, an exposure apparatus for manufacturing thin film magnetic heads, an exposure apparatus for manufacturing imaging devices (CCDs), an exposure apparatus for manufacturing micro machines, an exposure apparatus for manufacturing MEMSs, an exposure apparatus for manufacturing DNA chips, and an exposure apparatus for manufacturing reticles or masks.

It is to be noted that, in each of the above-described embodiments, a light transmission type mask on which a predetermined light-shielding pattern (or a phase pattern/light decreasing pattern) is formed on a light transmissive substrate is used, but, instead of such mask, an electronic mask that forms a transmission pattern, a reflection pattern, or a light emitting pattern based on the electronic data of a pattern to be exposed, as disclosed in, e.g., U.S. Pat. No. 6,778,257 (which mask is referred to also as a programmable mask and includes, e.g., a DMD (Digital Micro-mirror Device), which is a kind of non-light-emitting-type image display device (spatial light modulator)) or the like may also be used.

Furthermore, the present invention can be applied also to an exposure apparatus (lithography system) in which by forming interference fringes on substrate P, a line-and-space pattern is exposed onto substrate P, as disclosed in the PCT International Publication WO 2001/035168.

Still further, the present invention can be applied also to an exposure apparatus in which with the patterns of two masks being combined with each other on a substrate via a projection optical system, one shot area on the substrate is double-exposed substantially at the same time by a single scanning exposure process, as disclosed in Published Japanese Translation No. 2004-519850 of the PCT International Publication (which corresponds to U.S. Pat. No. 6,611,316).

It should be noted that to the extent the statutes of the countries designated or selected by this international application permit, the disclosures, related to, e.g., the exposure apparatus, of all of the patent application publications and the United States patents cited in connection with the above-described embodiments and modifications thereof are incorporated herein by reference and constitute a part of this specification text.

Exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy. The process of assembling each subsystem into the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that every accuracy is maintained in the complete exposure apparatus. Additionally, it is desirable to manufacture the exposure apparatus in a clean room, in which the temperature, purity, etc. are controlled.

As shown in FIG. 9, micro devices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; step 204 which includes substrate processing processes such as a process in which the mask pattern is exposed onto the substrate by exposure apparatus EX according to the above-described embodiments, a process in which the exposed substrate is developed, and a process in which the developed substrate is heated (cured) and etched; device assembly step 205 (including fabrication processes such as a dicing process, a bonding process, and a packaging process); inspection step 206.

INDUSTRIAL APPLICABILITY

In accordance with the present invention, an optimum exposure condition when exposing a substrate via the liquid of a liquid immersion region can be determined, and the substrate can be exposed well based on the determined exposure condition. Therefore, the present invention becomes extremely useful for the exposure method and apparatus for manufacturing a broad range of products such as semiconductor devices, liquid crystal display devices or displays, thin film magnetic heads, CCDs, micro machines, MEMSs, DNA chips, and reticles (masks).

The invention claimed is:

1. A method for determining an exposure condition used when exposing a substrate held by a substrate holder by irradiating the substrate with exposure light via a liquid, the method comprising:
    before the substrate is exposed,
        forming a liquid immersion region on a predetermined object, and
        while forming the liquid immersion region, changing at least a first parameter, being a parameter of at least one of a movement condition of the object and a liquid immersion condition when forming the liquid immersion region on the object, by setting the first parameter to different parameter values, and
        while changing the first parameter, detecting a situation of the liquid immersion region under different parameter values of the first parameter; and
    determining the exposure condition, the exposure condition including a second parameter used when exposing the substrate and determined based on the detecting the situation of the liquid immersion region under the different parameter values of the first parameter,
    the first parameter and the second parameter being
        a parameter of supplying the liquid to the immersion region on the object from a liquid supply device, and a parameter of supplying the liquid to an immersion region on the substrate from the liquid supply device when exposing the substrate, respectively, or
        a parameter of recovering the liquid from the immersion region on the object by a liquid recovery device, and a parameter of recovering the liquid from the immersion region on the substrate by the liquid recovery device when exposing the substrate, respectively, wherein
    the second parameter is a per-unit-time liquid supply amount in which the liquid supply device supplies the liquid to the liquid immersion region when exposing the substrate or a per-unit-time liquid recovery amount in which the liquid recovery device recovers the liquid from the liquid immersion region when exposing the substrate.

2. A determination method according to claim 1, wherein the object is the substrate or has a surface condition substantially equivalent to that of the substrate.

3. A determination method according to claim 1, wherein the substrate is irradiated with the exposure light via an optical member, wherein the liquid immersion region is formed on the object by filling with the liquid a predetermined space between the object and the optical member which faces the surface of the object and through which the exposure light passes, and wherein the situation of the liquid immersion region includes the leakage of the liquid of the liquid immersion region with which the predetermined space is filled.

4. A determination method according to claim 3, wherein by detecting the edge portion of the liquid immersion region, presence of the leakage of the liquid of the liquid immersion region is judged.

5. A determination method according to claim 3, wherein by detecting information relating to at least one of the position, the size, and the shape of the liquid immersion region, presence of the leakage of the liquid of the liquid immersion region is judged.

6. A determination method according to claim 3, wherein by detecting the position of the edge of the liquid immersion region relative to the predetermined space, presence of the leakage of the liquid of the liquid immersion region is judged.

7. A determination method according to claim 1, wherein by receiving detection light via the liquid immersion region, the situation of the liquid immersion region is detected.

8. A determination method according to claim 7, wherein the surface of the object is irradiated with the detection light.

9. A determination method according to claim 7, wherein the detection light travels nearly parallel to the surface of the object.

10. A determination method according to claim 1, wherein the vicinity of the edge of the liquid immersion region is irradiated with detection light, and based on the light receiving results from a light receiving portion provided at a predetermined position relative to the detection light, the situation of the liquid immersion region is detected.

11. A determination method according to claim 1, wherein the liquid immersion region is imaged, and based on the imaging results, the situation of the liquid immersion region is detected.

12. A determination method according to claim 1, wherein the situation of the liquid immersion region is detected at least from the side of the object relative to the liquid immersion region.

13. A determination method according to claim 1, wherein the object has, at least a portion of its surface, a light transmitting portion, and wherein the situation of the liquid immersion region is detected via the light transmitting portion.

14. A determination method according to claim 1, wherein the situation of the liquid immersion region is detected at least during movement of the object.

15. A determination method according to claim 1, wherein the first parameter is a per-unit-time liquid supply amount in which the liquid supply device supplies the liquid to the liquid immersion region, and the second parameter is the per-unit-time liquid supply amount in which the liquid supply device supplies the liquid to the liquid immersion region on the substrate when exposing the substrate, or
    the first parameter is a per-unit-time liquid recovery amount in which the liquid recovery device recovers the liquid from the liquid immersion region, and the second parameter is the per-unit-time liquid recovery amount in which the liquid recovery device recovers the liquid from the liquid immersion region on the substrate when exposing the substrate.

16. A determination method according to claim 15, wherein
    the first parameter is the per-unit-time liquid supply amount in which a liquid supply device supplies the liquid to the liquid immersion region on the object, and the determining the exposure condition includes determining a per-unit-time liquid supply amount in which a liquid supply device supplies the liquid to the substrate when exposing the substrate, under which leakage of the liquid of the liquid immersion region does not occur when exposing the substrate and shortage of the liquid of the liquid immersion region does not occur when exposing the substrate, based on a correspondence between the situations of the liquid immersion region and the different parameter values, of the per-unit-time liquid supply amount in which the liquid supply device supplies the liquid to the liquid immersion region on the object, observed in the detecting.

17. A determination method according to claim 15, wherein
the first parameter is the per-unit-time liquid recovery amount in which a liquid recovery device recovers the liquid from the liquid immersion region on the object, and
the determining the exposure condition includes determining a per-unit-time liquid recovery amount in which a liquid recovery device recovers the liquid from the liquid immersion region, under which leakage of the liquid of the liquid immersion region does not occur when exposing the substrate and or shortage of the liquid of the liquid immersion region does not occur when exposing the substrate, based on a correspondence between the situations of the liquid immersion region and the different parameter values, of the per-unit time liquid recovery amount in which the liquid supply device recovers the liquid from the liquid immersion region on the object, observed in the detecting.

18. An exposure method comprising:
exposing the substrate based on the exposure condition determined by the determination method according to claim 1.

19. A device manufacturing method that uses the exposure method according to claim 18.

20. A determination method according to claim 1, wherein the predetermined object is a dummy substrate or a substrate stage which has the substrate holder.

21. A determination method according to claim 1, wherein the detecting is performed while also changing a parameter of moving the object when forming the liquid immersion region on the object, and the exposure condition further includes at least one of a moving speed, a moving distance, and a moving direction of the substrate, held by the substrate holder, when exposing the substrate determined based on the detecting.

22. A determination method according to claim 1, wherein the situation of the liquid immersion region includes at least one of a largeness of the liquid immersion region, a position of an edge of the liquid immersion region, a bubble in the liquid immersion region, and a situation in which a leakage from the liquid immersion region has occurred.

23. A determining method according to claim 1, wherein the predetermined object includes a substrate stage which has the substrate holder.

24. A determining method according to claim 23, wherein the detecting is performed while also changing a parameter, of moving the object when forming the liquid immersion region on the object, that is at least one of a moving speed, a moving distance, and a moving direction of the substrate stage.

25. A determining method according to claim 1, wherein the detection of the situation of the liquid immersion region is performed before the substrate is held by the substrate holder.

26. A determining method according to claim 25, wherein a dummy substrate is held by the substrate holder when the detection of the situation of the liquid immersion region is performed.

27. A determination method according to claim 1, wherein in the determining the exposure condition, the second parameter is determined based on a correspondence between the situations of the liquid immersion region and the different parameter values of the first parameter observed in the detecting.

28. A method for determining an exposure condition used when exposing a substrate held by a substrate holder by irradiating the substrate with exposure light via a liquid, the method comprising:
before the substrate is exposed,
forming a liquid immersion region on a predetermined object, and
while forming the liquid immersion region, changing at least a first parameter, being a parameter of at least one of a movement condition of the object and a liquid immersion condition when forming the liquid immersion region on the object, by setting the first parameter to different parameter values, and
while changing the first parameter, detecting a situation of the liquid immersion region under different parameter values of the first parameter; and
determining the exposure condition, the exposure condition including a second parameter used when exposing the substrate and determined based on the detecting the situation of the liquid immersion region under the different parameter values of the first parameter,
the first parameter and the second parameter being
a parameter of moving the object when forming the liquid immersion region on the object, and a parameter of moving the substrate when exposing the substrate, respectively, or
a parameter of supplying the liquid to the immersion region on the object from a liquid supply device, and a parameter of supplying the liquid to an immersion region on the substrate from the liquid supply device when exposing the substrate, respectively, or
a parameter of recovering the liquid from the immersion region on the object by a liquid recovery device, and a parameter of recovering the liquid from the immersion region on the substrate by the liquid recovery device when exposing the substrate, respectively, wherein
the changing the first parameter and the detecting are performed while the object is in movement along a movement trajectory and while the liquid supply device is supplying the liquid to the liquid immersion region on the object, and comprises
setting a movement speed of the object to different speeds while the liquid immersion region is being formed on the object, and, simultaneously,
setting a per-unit-time liquid supply amount, in which the liquid supply device supplies the liquid to the liquid immersion region on the object, to different per-unit-time liquid supply amounts while the liquid immersion region is being formed on the object,
the detecting comprises observing whether leakage or shortage of the liquid of the liquid immersion region on the object occurs under each of the different speeds and the different per-unit-time liquid supply amounts, and
the determining the exposure condition includes determining, based on the observing under each of the different speeds and per-unit-time liquid supply amounts, a condition, which includes a maximum movement speed of the substrate and a per-unit-time liquid supply amount that the liquid supply device supplies to the liquid immersion region of the substrate, under which leakage and shortage of the liquid of the liquid immersion region on the substrate does not occur when exposing the substrate.

29. An exposure apparatus configured to perform exposure of a substrate via an optical member and a liquid, the exposure apparatus comprising:
a substrate holder which holds the substrate;
a nozzle that fills a predetermined space between the optical member and the substrate held by the substrate holder with the liquid to form a liquid immersion region on a predetermined object, the nozzle being configured to form the liquid on the substrate when exposure is to be performed;
a detector that performs detection, before the substrate is exposed, a situation of the liquid immersion region under different parameter values of at least a first parameter, being a parameter of one of a movement condition of the object and a liquid immersion condition for forming of the liquid immersion region on the object while changing the first parameter to the different parameter values while the liquid immersion region is being formed on the object; and
a controller that, based on the detection results, determines an exposure condition used when exposing the substrate, the exposure condition including a second parameter used when exposing the substrate and determined based on the detection of the situation of the liquid immersion region under the different parameter values of the first parameter,
the first parameter and the second parameter being
a parameter of supplying the liquid to the immersion region on the object from a liquid supply device, and a parameter of supplying the liquid to an immersion region on the substrate from the liquid supply device when exposing the substrate, respectively, or
a parameter of recovering the liquid from the immersion region on the object by a liquid recovery device, and a parameter of recovering the liquid to the immersion region on the substrate by the liquid recovery device when exposing the substrate, respectively, wherein
the second parameter is a per-unit-time liquid supply amount in which the liquid supply device supplies the liquid to the liquid immersion region when exposing the substrate or a per-unit-time liquid recovery amount in which a liquid recovery device recovers the liquid from the liquid immersion region when exposing the substrate.

30. An exposure apparatus according to claim 29, further comprising a memory that stores the detection results.

31. An exposure apparatus according to claim 29, wherein the object is the substrate or has a surface condition substantially equivalent to that of the substrate.

32. An exposure apparatus according to claim 29, wherein the detector detects information relating to the leakage of the liquid of the liquid immersion region with which the predetermined space is filled.

33. An exposure apparatus according to claim 29, wherein the detector receives detection light via the liquid immersion region.

34. An exposure apparatus according to claim 29, wherein the detector images the liquid immersion region.

35. An exposure apparatus according to claim 29, wherein the detector detects the situation of the liquid immersion region at least from the side of the object relative to the liquid immersion region.

36. An exposure apparatus according to claim 29, wherein the detector detects the situation of the liquid immersion region at least during movement of the object.

37. An exposure apparatus according to claim 29, wherein the detecting is performed while also changing a third parameter, and the exposure condition includes a fourth parameter, and the third parameter and the fourth parameter are
a moving speed of the object when forming the liquid immersion region on the object, and a moving speed of the substrate when exposing the substrate, respectively,
a moving distance of the object when forming the liquid immersion region on the object, and a moving distance of the substrate when exposing the substrate, respectively, or
a movement direction of the object when forming the liquid immersion region on the object, and a movement direction of the substrate when exposing the substrate, respectively.

38. An exposure apparatus according to claim 29, wherein the first parameter is a per-unit-time liquid supply amount in which the liquid supply device supplies the liquid to the liquid immersion region, and the second parameter is a per-unit-time liquid supply amount in which the liquid supply device supplies the liquid to the liquid immersion region on the substrate when exposing the substrate, or the first parameter is a per-unit-time liquid recovery amount in which the liquid recovery device recovers the liquid from the liquid immersion region, and the second parameter is a per-unit-time liquid recovery amount in which the liquid recovery device recovers the liquid from the liquid immersion region on the substrate when exposing the substrate.

39. A device manufacturing method, comprising:
exposing a substrate by using the exposure apparatus according to claim 29; and
developing the exposed substrate.

40. An exposure apparatus according to claim 29, wherein the object includes a dummy substrate or a substrate stage which has the substrate holder.

41. An exposure apparatus according to claim 29, wherein the detecting is performed while also changing a parameter of moving the object when forming the liquid immersion region on the object, and the exposure condition further includes at least one of a moving speed, a moving distance, and a moving direction of the substrate, held by the substrate holder, when exposing the substrate determined based on the detecting.

42. An exposure apparatus according to claim 29, wherein the situation of the liquid immersion region includes at least one of a largeness of the liquid immersion region, a position of an edge of the liquid immersion region, a bubble in the liquid immersion region, and a situation in which a leakage from the liquid immersion region has occurred.

43. An exposure apparatus according to claim 29, wherein the object includes a substrate stage which has the substrate holder.

44. An exposure apparatus according to claim 43, wherein the detecting is performed while also changing a parameter, of moving the object when forming the liquid immersion region on the object, that is at least one of a moving speed, a moving distance, and a moving direction of the substrate stage.

45. An exposure apparatus according to claim 29, wherein the detector detects the situation of the liquid immersion region before the substrate is held by the substrate holder.

46. An exposure apparatus according to claim 45, wherein a dummy substrate is held by the substrate holder when the detector detects the situation of the liquid immersion region.

47. An exposure apparatus according to claim 29, wherein in the determining the exposure condition, the second parameter is determined based on a correspondence between the situations of the liquid immersion region and the different parameter values of the first parameter observed in the detecting.

48. A method for determining an exposure condition used when exposing a substrate held by a substrate holder by irradiating the substrate with exposure light via a liquid immersion medium formed on the substrate, the method comprising:

before the substrate is exposed,
while a liquid immersion region is being formed on a predetermined object, moving the predetermined object together with the liquid immersion region along a movement trajectory,
while performing the moving, changing a movement condition of the object, the movement condition including at least one of a moving speed, a moving distance, and a moving direction of the object, and
while performing the changing, detecting a situation of the liquid immersion region under different states of the movement condition; and
determining the exposure condition based on the detection results, the exposure condition including at least one of a moving speed, a moving distance, and a moving direction of the substrate held by the substrate holder, wherein
the movement condition of the object includes the moving speed of the object,
the situation of the liquid immersion region includes whether leakage of the liquid out of a predetermined space has occurred, and
the exposure condition includes a maximum movement speed of the substrate that still avoids leakage or shortage of the liquid of the liquid immersion region when exposing the substrate, determined based on a correspondence between the situations of the liquid immersion region and the different states of the movement condition observed in the detecting.

* * * * *

UNITED STATES PATENT AND TRADEMARK OFFICE
CERTIFICATE OF CORRECTION

PATENT NO. : 9,239,524 B2
APPLICATION NO. : 11/887344
DATED : January 19, 2016
INVENTOR(S) : Yoshiki Kida et al.

Page 1 of 1

It is certified that error appears in the above-identified patent and that said Letters Patent is hereby corrected as shown below:

In the claims

Column 27, Line 22, Claim 17
Delete "and or" and insert -- and --, therefor.

Column 27, Line 26, Claim 17
Delete "per-unit time" and insert -- per-unit-time --, therefor.

Signed and Sealed this
Tenth Day of May, 2016

Michelle K. Lee
*Director of the United States Patent and Trademark Office*